United States Patent [19]

Nara

[11] Patent Number: 6,061,823
[45] Date of Patent: May 9, 2000

[54] ERROR CORRECTING/DECODING APPARATUS AND ERROR CORRECTING/ DECODING METHOD

[75] Inventor: Hideaki Nara, Tokyo, Japan

[73] Assignee: Mitsubishi Denki Kabushiki Kaisha, Tokyo, Japan

[21] Appl. No.: 08/953,622

[22] Filed: Oct. 17, 1997

[30] Foreign Application Priority Data

Apr. 23, 1997 [JP] Japan ................................ 9-105757

[51] Int. Cl.[7] .................................................. G06F 11/10
[52] U.S. Cl. ............................ 714/758; 714/794; 714/795
[58] Field of Search .................................. 714/758, 794, 714/795, 760, 786

[56] References Cited

U.S. PATENT DOCUMENTS 5,321,705  6/1994  Gould et al. ............................. 371/43
5,361,266  11/1994  Kodama et al. ........................ 371/37.7
5,577,053  11/1996  Dent ....................................... 371/37.4
5,770,927  6/1998  Abe ........................................ 375/340

FOREIGN PATENT DOCUMENTS 6284018  10/1994  Japan .

*Primary Examiner*—Albert De Cady
*Assistant Examiner*—Esaw Abraham
*Attorney, Agent, or Firm*—Rothwell, Figg, Ernst & Kurz

[57] ABSTRACT

The demodulator demodulates received data, the Viterbi decoder decodes the received data to a bit sequence with the Viterbi algorithm according to the soft-decision estimate generated in demodulation and at the same time appends a reliability to each bit in the bit sequence. Then, a CRC circuit determines whether any error is detected or not by executing CRC on the decoded bit sequences, and, if no error is detected, the bit sequence is output as decoded data. On the other hand, if any error is detected, bit inversion is executed in the ascending order of sums of reliability for bits to be inverted until no error is detected by the CRC circuit. For this reason, the case of error detection is decreased and the work load for computing is decreased.

31 Claims, 32 Drawing Sheets

| METHOD | (a) | | (b) | | (c) | |
|---|---|---|---|---|---|---|
| BIT SEQUENCE | 00000 | 01101 | 00000 | 01101 | 00000 | 01101 |
| RELIABILITY | 35241 | 35241 | 35241 | 35241 | 35241 | 35241 |
| ORDER OF BIT INVERSION 1 | 00001 | 01100 | 00001 | 01100 | 00001 | 01100 |
| 2 | 00100 | 01001 | 00100 | 01001 | 00100 | 01001 |
| 3 | 10000 | 11101 | 10000 | 11101 | 10000 | 11101 |
| 4 | 00101 | 01000 | 00101 | 01000 | 00101 | 01000 |
| 5 | 00010 | 01111 | 00010 | 01111 | 10001 | 11100 |
| 6 | 10001 | 11100 | 10001 | 11100 | 00010 | 01111 |
| 7 | 01000 | 00101 | 01000 | 00101 | 10100 | 11001 |
| 8 | 00011 | 01110 | 10100 | 11001 | 01000 | 00101 |
| 9 | 10100 | 11001 | 00011 | 01110 | 00011 | 01110 |
| 10 | 01001 | 00100 | 01001 | 00100 | 10101 | 11000 |
| 11 | 00110 | 01011 | 00110 | 01011 | 01001 | 00100 |
| 12 | 10101 | 11000 | 10101 | 11000 | 00110 | 01011 |
| 13 | 01100 | 00001 | 10010 | 11111 | 10010 | 11111 |
| 14 | 10010 | 11111 | 01100 | 00001 | 01100 | 00001 |
| 15 | 00111 | 01010 | 00111 | 01010 | 00111 | 01010 |
| 16 | 11000 | 10101 | 11000 | 10101 | 11000 | 10101 |
| 17 | 01101 | 00000 | 10011 | 11110 | 10011 | 11110 |
| 18 | 10011 | 11110 | 01101 | 00000 | 01101 | 00000 |
| 19 | 01010 | 00111 | 01010 | 00111 | 11001 | 10110 |
| 20 | 11001 | 10100 | 11001 | 10100 | 10110 | 11011 |
| 21 | 10110 | 11011 | 10110 | 11011 | 01010 | 11001 |
| 22 | 01011 | 00110 | 11100 | 00110 | 11100 | 00110 |
| 23 | 11100 | 10001 | 01011 | 10001 | 10111 | 11010 |
| 24 | 10111 | 11010 | 10111 | 11010 | 01011 | 10001 |
| 25 | 01110 | 00011 | 01110 | 00011 | 11101 | 10000 |
| 26 | 11101 | 10000 | 11101 | 10000 | 01110 | 00011 |
| 27 | 11010 | 10111 | 11010 | 10111 | 11010 | 10111 |
| 28 | 01111 | 00010 | 01111 | 00010 | 01111 | 00010 |
| 29 | 11011 | 10110 | 11011 | 10110 | 11011 | 10110 |
| 30 | 11110 | 10011 | 11110 | 10011 | 11110 | 10011 |
| 31 | 11111 | 10010 | 11111 | 10010 | 11111 | 10010 |

FIG.3

| BIT SEQUENCE | | 00000 | 01101 |
|---|---|---|---|
| RELIABILITY | | 35241 | 35241 |
| ORDER OF BIT INVERSION | 1 | 00001 | 01100 |
| | 2 | 00100 | 01001 |
| | 3 | 00101 | 01000 |
| | 4 | 10000 | 11101 |
| | 5 | 10001 | 11100 |
| | 6 | 10100 | 11001 |
| | 7 | 10101 | 11000 |
| | 8 | 00010 | 01111 |
| | 9 | 00011 | 01110 |
| | 10 | 00110 | 01011 |
| | 11 | 00111 | 01010 |
| | 12 | 10010 | 11111 |
| | 13 | 10011 | 11110 |
| | 14 | 10110 | 11011 |
| | 15 | 10111 | 11010 |
| | 16 | 01000 | 00101 |
| | 17 | 01001 | 00100 |
| | 18 | 01100 | 00001 |
| | 19 | 01101 | 00000 |
| | 20 | 11000 | 10101 |
| | 21 | 11001 | 10100 |
| | 22 | 11100 | 10001 |
| | 23 | 11101 | 10000 |
| | 24 | 01010 | 00111 |
| | 25 | 01011 | 00110 |
| | 26 | 01110 | 00011 |
| | 27 | 01111 | 00010 |
| | 28 | 11010 | 10111 |
| | 29 | 11011 | 10110 |
| | 30 | 11110 | 10011 |
| | 31 | 11111 | 10010 |

FIG.16

| METHOD | (a) | | (b) | |
|---|---|---|---|---|
| BIT SEQUENCE | 00000 | 01101 | 00000 | 01101 |
| RELIABILITY | 35241 | 35241 | 35241 | 35241 |
| 1 | 00001 | 01100 | 00001 | 01100 |
| 2 | 00100 | 01001 | 00100 | 01001 |
| 3 | 10000 | 11101 | 10000 | 11101 |
| 4 | 00010 | 01111 | 00010 | 01111 |
| 5 | 01000 | 00101 | 01000 | 00101 |
| 6 | 00101 | 01000 | 00101 | 01000 |
| 7 | 10001 | 11100 | 10001 | 11100 |
| 8 | 00011 | 01110 | 10100 | 11001 |
| 9 | 10100 | 11001 | 00011 | 01110 |
| 10 | 01001 | 00100 | 01001 | 00100 |
| 11 | 00110 | 01011 | 00110 | 01011 |
| 12 | 01100 | 00001 | 10010 | 11111 |
| 13 | 10010 | 11111 | 01100 | 00001 |
| 14 | 11000 | 10101 | 11000 | 10101 |
| 15 | 01010 | 00111 | 01010 | 00111 |
| 16 | 10101 | 11000 | 10101 | 11000 |
| 17 | 00111 | 01010 | 00111 | 01010 |
| 18 | 01101 | 00000 | 10011 | 11110 |
| 19 | 10011 | 11110 | 01101 | 00000 |
| 20 | 11001 | 10100 | 11001 | 10100 |
| 21 | 10110 | 11011 | 10110 | 11011 |
| 22 | 01011 | 00110 | 11100 | 10001 |
| 23 | 11100 | 10001 | 01011 | 00110 |
| 24 | 01110 | 00011 | 01110 | 00011 |
| 25 | 11010 | 10111 | 11010 | 10111 |
| 26 | 10111 | 11010 | 10111 | 11010 |
| 27 | 11101 | 11000 | 11101 | 11000 |
| 28 | 01111 | 00010 | 01111 | 00010 |
| 29 | 11011 | 10110 | 11011 | 10110 |
| 30 | 11110 | 10011 | 11110 | 10011 |
| 31 | 11111 | 10010 | 11111 | 10010 |

Order of bit inversion shown in leftmost column.

FIG.19

| BIT SEQUENCE | | 00000 | 01101 |
|---|---|---|---|
| RELIABILITY | | 35241 | 35241 |
| ORDER OF BIT INVERSION | 1 | 10000 | 11101 |
| | 2 | 01000 | 00101 |
| | 3 | 00100 | 01001 |
| | 4 | 00010 | 01111 |
| | 5 | 00001 | 01100 |
| | 6 | 11000 | 10101 |
| | 7 | 10100 | 11001 |
| | 8 | 10010 | 11111 |
| | 9 | 10001 | 11100 |
| | 10 | 01100 | 00001 |
| | 11 | 01010 | 00111 |
| | 12 | 01001 | 00100 |
| | 13 | 00110 | 01011 |
| | 14 | 00101 | 01000 |
| | 15 | 00011 | 01110 |
| | 16 | 11100 | 10001 |
| | 17 | 11010 | 10111 |
| | 18 | 11001 | 10100 |
| | 19 | 10110 | 11011 |
| | 20 | 10101 | 11000 |
| | 21 | 10011 | 11110 |
| | 22 | 01110 | 00011 |
| | 23 | 01101 | 00000 |
| | 24 | 01011 | 00110 |
| | 25 | 00111 | 01010 |
| | 26 | 11110 | 10011 |
| | 27 | 11101 | 10000 |
| | 28 | 11011 | 10110 |
| | 29 | 10111 | 11010 |
| | 30 | 01111 | 00010 |
| | 31 | 11111 | 10010 |

FIG.22

ERROR CORRECTING/DECODING APPARATUS AND ERROR CORRECTING/ DECODING METHOD

FIELD OF THE INVENTION

This invention relates to an error correcting/decoding apparatus as well as to an error correcting/decoding method for correcting an error generated in decoded data in the field of digital radio communications or the like in which data is encoded and transmitted using concatenated code obtained by encoding with CRC code and then convolution code.

BACKGROUND OF THE INVENTION

FIG. 31 is a block diagram showing configuration of an error correcting/decoding apparatus for correcting errors in concatenated code based on the conventional technology. In this figure, designated at the reference numeral 1 is a demodulator for generating a soft-decision estimate for a received bit from amplitude and phase of received waveform, at 2B a Viterbi decoder for correcting errors by selecting the highest priority path according to the soft-decision estimate output from the demodulator 1, and at 3 a CRC means for executing a cyclic redundancy check (described as "CRC" hereinafter) on an input bit sequence.

Next description is made for operation. At first, demodulation is executed in the demodulator 1, and at the same time soft-decision estimate for a received signal is computed from amplitude and a phase of the received signal. In the Viterbi decoder 2B, a path with a large path metric is selected according to the soft-decision estimate generated in the demodulator, and decoded data after trace back is generated. Then CRC is executed on an input bit sequence in the CRC means 3, and if no error is detected, this bit sequence is output as decoded data and the decoding operation is terminated, and if any error is detected, the decoding operation is terminated an error detection.

FIG. 32 is a block diagram showing configuration of an error correcting/decoding apparatus for correcting errors in concatenated code based on the conventional technology shown in Japanese Patent Laid Open Publication No. HEI 6-284018. In this figure, designated at the reference numeral 1 is a demodulator, at 3 a CRC means, at 13 a multi-traceback Viterbi decoder capable of selecting a subset of candidates, when executing Viterbi decoding according to the soft-decision estimate output from the demodulator 1, by executing traceback several times, at 6 a bit sequence storing means for storing therein a bit sequence output from the CRC means, and at 14 a decoded data selector for selecting one candidate from the subset of candidates.

Next description is made for operation. At first, demodulation is executed in the demodulator 1, and at the same time soft-decision estimate for a received signal is computed from amplitude and a phase of a received signal. In the multi-traceback Viterbi decoder 13, a subset of paths are stored when ACS (Add Compare Select) is executed according to the soft-decision estimate generated in the demodulator 1, and when decoded data is obtained by means of traceback, a subset of bit sequences are obtained by executing traceback for each of the paths in the subset. Error detection is executed by the CRC means 3 to the subset of bit sequences obtained as described above, and a candidate in which no error is detected is stored in the bit sequence storing means 6, and final decoded data are decided by a decoded data selector 14 from the candidates, then the decoding operation is terminated.

However, in the concatenated code error correcting/ decoding apparatus based on the conventional technology shown in FIG. 31, if an error is present even in one bit when Viterbi decoding is executed, an error is detected by CRC, so that the number of detected errors increases, and resultantly the effect provided by the error correcting capability becomes disadvantageously lower.

Also in the concatenated code error correcting/decoding apparatus based on the conventional technology shown in FIG. 32, traceback is executed several times, and a promising candidate is selected from a subset of candidates obtained through the traceback operation above to be treated as decoded data, and thus it becomes possible to perform an error correcting/decoding operation with higher reliability leaving paths aborted in the error correcting/decoding apparatus based on the conventional technology shown in FIG. 31, but as traceback is executed several times leaving a subset of candidates when ACS is executed, a work load for computing substantially increases, which is disadvantageous.

SUMMARY OF THE INVENTION

It is an object of the present invention to provide an error correcting/decoding apparatus and an error correcting/ decoding method each enabling improvement in the error correcting/decoding capability without increasing a work load for computing.

With the present invention, there are provided the steps of demodulating received data and generating soft-decision estimate based on the received data; decoding said received data demodulated as described above to a bit sequence with the Viterbi algorithm according to said generated soft-decision estimate; checking whether any error is included or not by executing CRC on the decoded bit sequence; executing bit inversion for the bit sequence when any error is detected and checking whether any error is included or not by again executing CRC on the bit sequence having been subjected to bit inversion; and outputting the bit sequence as decoded data when no error is detected, so that, when a few bits are erroneous in a bit sequence decoded by Viterbi decoding, the bits can be corrected by means of bit inversion, which ensures an improved error correcting capability. As for the work load for computing, the work load for the Viterbi decoding operation sharing a large portion of decoding operation does not increase, and increase in the work load for computing is limited to that in the CRC operation and addition of the bit inverting operation, and the increase in the work load for computing as a whole is negligible.

Other objects and features of this invention will become understood from the following description with reference to the accompanying drawings.

BRIEF DESCRIPTION OF THE DRAWINGS

FIG. 3 is an explanatory view illustrating an example of a bit inversion sequence in the bit inverter 4A in Embodiment 1;

FIG. 16 is an explanatory view illustrating an example of bit inversion in the bit inverter 4B in Embodiment 7;

FIG. 19 is an explanatory view illustrating an example of a bit inversion sequence in the bit inverter 4C according to Embodiment 8;

FIG. 22 is an explanatory view illustrating an example of a bit inversion sequence in the bit inverter 4D in Embodiment 9;

DESCRIPTION OF THE PREFERRED EMBODIMENTS

Next description is made for Embodiment 1 of the error correcting/decoding apparatus according to the present invention.

Figure 1:
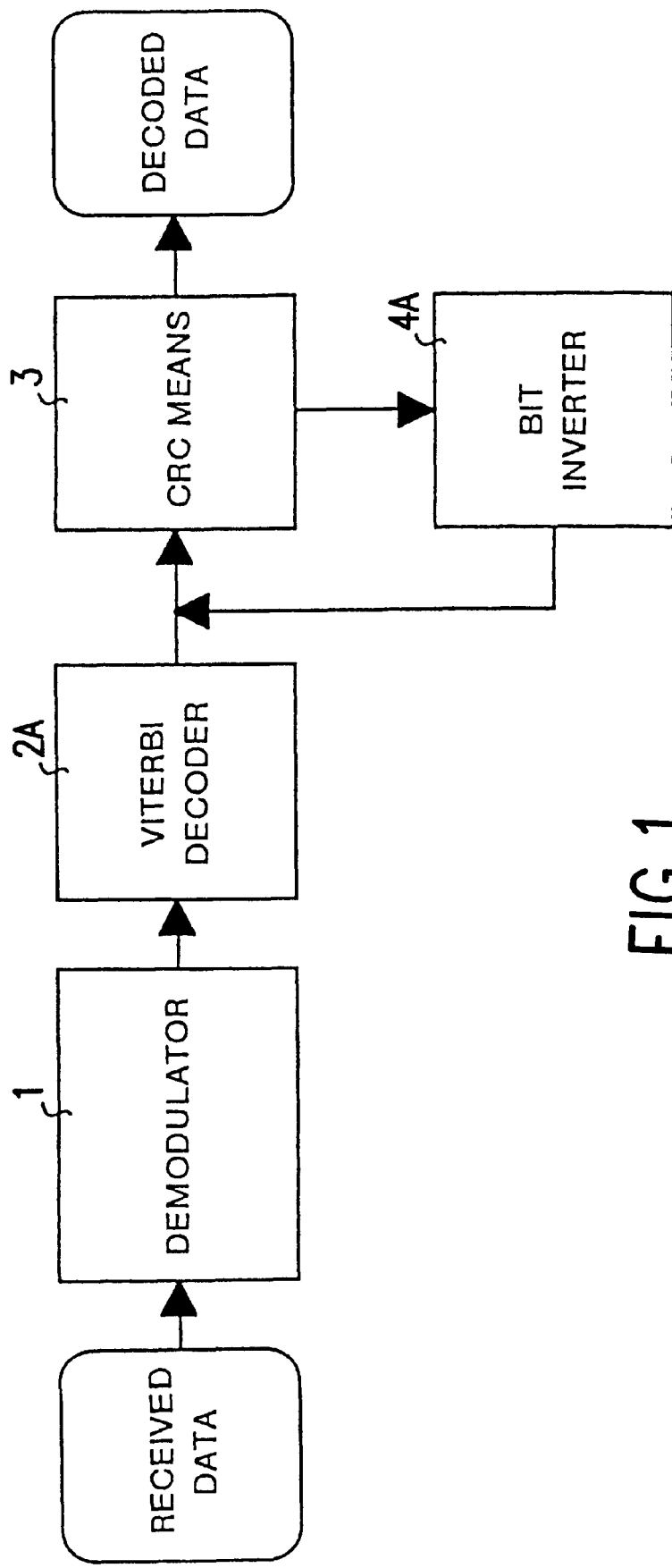
FIG. 1 is a block diagram showing the configuration of the error correcting/decoding apparatus according to Embodiment 1 of the present invention.

FIG. 1 is a block diagram showing the configuration of the error correcting/decoding apparatus according to Embodiment 1 of the present invention.

In this figure, designated at the reference numeral 1 is a demodulator for demodulating received data and also generating a soft-decision estimate for a received bit from amplitude and a phase of the received waveform, at 2A a Viterbi decoder for executing error correction by selecting the highest priority path according to the soft-decision estimate output from the demodulator 1 and also giving a difference between branch metrics used in the selecting operation as reliability to the decoded bit sequence, at 3 a CRC means for executing CRC to an input bit sequence, and at 4A a bit inverter for executing bit inversion in ascending order of sums of reliability for bits to be inverted. It should be noted that, although in this Embodiment 1 as well as in Embodiments 2 to 14, a difference between branch metrics used when executing decoding according to the Viterbi algorithm is used as reliability, in the present invention, a difference in path metrics or the like may be used when executing decoding according to the Viterbi algorithm.

Next description is made for operation.

Figure 2:
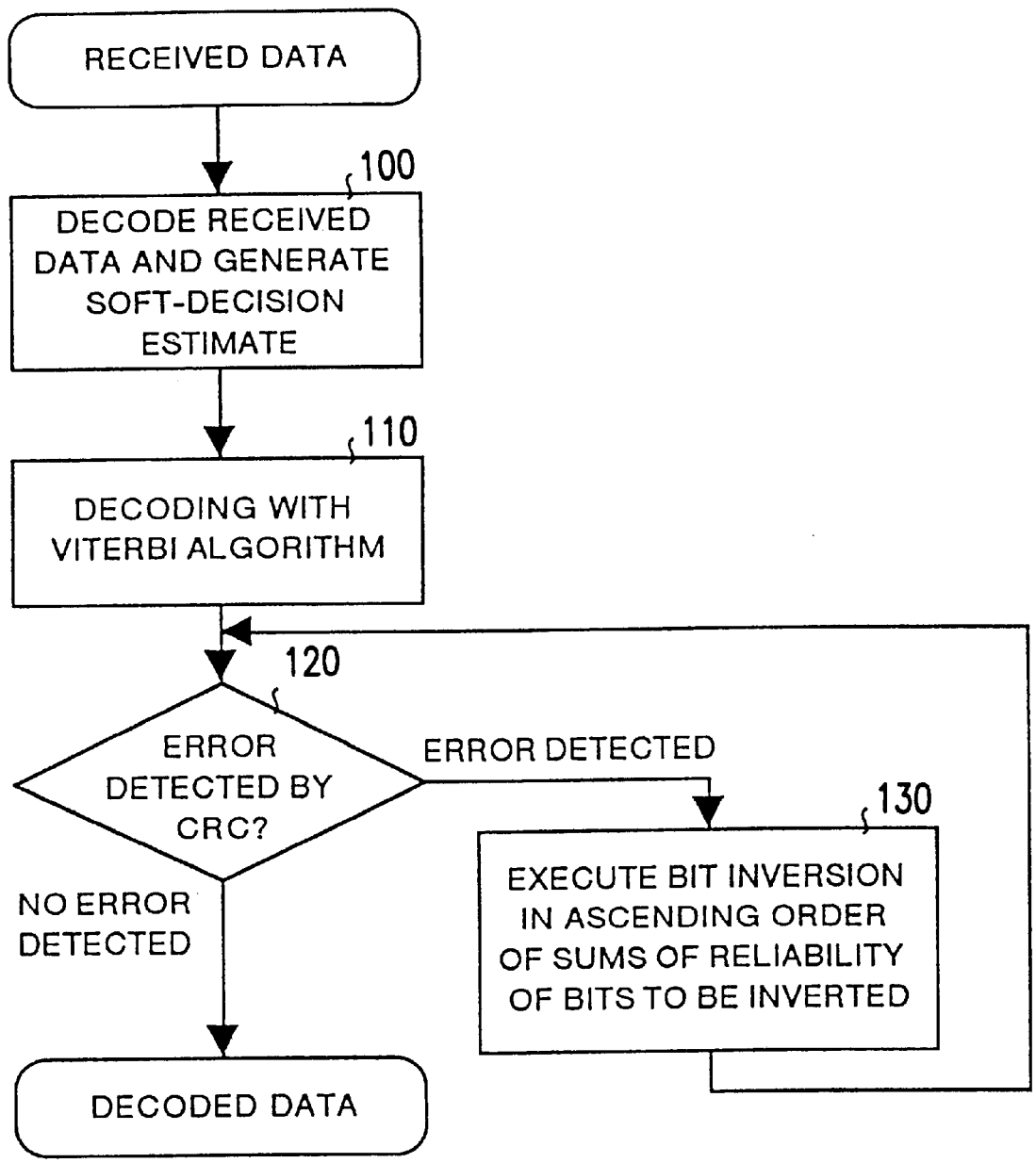
FIG. 2 is a flowchart showing a concatenated code error correcting/decoding method by the error correcting/ decoding apparatus according to Embodiment 1.

FIG. 2 is a flowchart showing a sequence of operations by a decoder in the concatenated code error correcting/decoding method in Embodiment 1 of the present invention.

When received data is input into the demodulator 1, at first the demodulator 1 demodulates the received data, and also computes a soft-decision estimate from amplitude and a phase of a received signal (step 100). Then, the Viterbi decoder 2A selects a path with a large path metric according to the soft-decision estimate generated in the demodulator 1, and decoded data after traceback is generated (step 110). Then, a difference in branch metrics used in the selecting operation is appended to each bit in the decoded bit sequence as a reliability indicator.

Then determination is made as to whether error detection can be executed or not by executing CRC on a bit sequence input from the CRC means 3 (step 120). Herein, when no error is detected ("No error detected" in step 120), this bit sequence is output as decoded data and the decoding operation is terminated, but when any error is detected ("Error detected" in step 120), bit inversion is executed in ascending order of sums of reliability of bits to be inverted to the bit sequence obtained by decoding by the bit inverter 4A according to the Viterbi algorithm (step 130), the bit sequence is again sent to the CRC means 3, and determination is made as to whether error detection is possible or not by executing the processing in step 120 above.

With this feature, in Embodiment 1, the processing for bit inversion in this step 130 is repeated until no error is detected by the CRC means 3.

(a), (b) and (c) in FIG. 3 show a concrete example of the order of bit inversion in the bit inverter 4A in Embodiment 1 respectively.

It should be noted that, in each of (a) to (c) in FIG. 3, two bit sequences of "00000" and "01101" are subjected to bit inversion, and the reliability of the sequence is "35241" in all cases.

This figure shows a method of executing bit inversion in which bit inversion is usually executed in ascending order of sums of reliability of bits to be inverted, but also in ascending order of sums of bits to be inverted when there are equal sums of reliability, and also bit inversion is executed in ascending order of reliability when sums of bits to be inverted are equal, but in an arbitrary order (for instance in the order of priority of left bit) when the reliability is identical.

Namely, in this method, as shown (a) in FIG. 3, bit inversion is executed from the first bit inversion order (1) up to the thirty-first bit inversion order (31), and for instance, in a case of a bit sequence of "00000", for the third and fourth bit inversion orders, the first bit (reliability 3) from the left end and a set of the third bit (reliability 2) from the left end and the fifth bit (reliability 1) from the left end each have a sum of reliability of 3 and are thus equal to each other, but in this method, when are there are equal sums of reliability as described above, priority is put on a set with a smaller number of bits to be inverted, so that the first bit (reliability 3) from the left end with the bit inversion order of 3rd is inverted first and then a set of the third bit (reliability 2) from the left end and the fifth bit (reliability 1) from the left end. with the bit inversion order of 4th are subjected to bit. inversion.

Also in a case of a bit sequence of "00000", for the 8th and 9th bit inversion orders, both a set of the fourth bit. (reliability 4) from the left end and the fifth bit (reliability 1) from the left end and a set of the first bit (reliability 3) from the left end and the third bit (reliability 2) from the left end equally have a sum of reliability of 5, and also the number of bits to be inverted are equal, and in this method, priority is put on a set with smaller reliability, so that, for the 8th bit inversion order, at first, a set of the fourth bit (reliability 4) and the fifth bit (reliability 1) from the left end is subjected to bit inversion, and then, for the 9th bit inversion order, a set of the third bit (reliability 2) and the first bit from the left end (reliability 3) is subjected to bit inversion (b) in FIG. 3 shows a method in which bit inversion usually is executed in ascending order of sums of reliability of bits to be inverted, but priority is put on a smaller sum of bits to be inverted when there are equal sums of reliability, and further bit inversion is executed in an arbitrary order (priority is put in the left bit herein) when there are sums of bits to be inverted.

Namely, in this method, as shown in (c) in FIG. 3, in a case of a bit sequence of, for instance, "00000", for the 8th and 9th bit inversion orders, both a set of the fourth bit (reliability 4) and the fifth bit (reliability 1) from the left end and a set of the first bit (reliability 3) and the third bit (reliability 2) from the left have a sum of reliability of 5 respectively, and also the number of bits to be inverted in both of the sets are equal, and for this reason, bit inversion is executed putting priority on the left side, and at first, when the bit inversion order is 8th, a set of the first bit (reliability 3) and the third bit (reliability 2) from the left end is subjected to bit inversion, and then, when the bit inversion order is 9th, a set of the fourth bit (reliability 4) and the fifth bit (reliability 1) from the left end is subjected to bit inversion.

(c) in FIG. 3 shows a method in which bit inversion is executed in ascending order of sums of reliability of bits to be inverted, but if there are equal sums of reliability, bit inversion is executed in an arbitrary order (herein priority put on the left side bit).

Namely, in this method, as shown in (c) in FIG. 3, in a case of a bit sequence of, for instance, "00000", for the 5th and 6th bit inversion orders, both a set of the first bit (reliability 3) and the fifth bit (reliability 1) from the left end and a set of the fourth bit (reliability 4) equally have a sum of reliability of 4, but in this case, bit inversion is executed preferentially from a set having a bit in the left side according to the principle of priority put on the left side bit, so that at first a set of the first bit (reliability 3) and the fifth bit (reliability 1) from the left end is subjected to bit inversion, and then the fourth bit (reliability 4) is subjected to bit inversion.

For the reasons as described above, with the error correcting/decoding apparatus according to Embodiment 1 of the present invention, reliability is appended to each bit in a bit sequence decoded according to the Viterbi algorithm, and when error detection by means of CRC is executed, if any error is detected, CRC is repeated concurrently with bit inversion executed in ascending order of sums of reliability for bits to be inverted until no error is detected, and an output bit at the point of time when no error is detected by means of CRC is selected and output as decoded data and then the decoding operation is terminated, so that, when only several bits are erroneous in a bit sequence decoded according to the Viterbi algorithm, the errors can be corrected by means of bit inversion, which ensures improvement in the error connecting capability.

Also, as for the work load for computing, the work load for Viterbi decoding operation sharing a larger portion of decoding does not increase, and the only increase in the work load is that for CRC operations and that for addition of bit inverting operation, so that the work load in the entire system is negligible.

Also in this Embodiment 1, bit inversion is executed on a decoded bit sequence in ascending order of sums of reliability appended to bits to be inverted, so that CRC can be executed in ascending order of reliability, which enables rapid error correction with a smaller work load for computing.

Namely, when a transmitted bit sequence is deduced from a received bit sequence, the decoded bit sequence is a most probable bit sequence, namely a bit sequence with the highest probability to match the transmitted bit sequence, and a reliability is given to each bit in a decoded bit sequence, and indicates how high the probability that the each bit is a decoded bit is, and the larger a value of reliability, the more reliable the bit is, and on the contrary, the smaller the value is, the less reliable the bit is. Thus, it can be considered that reliability of a decoded bit sequence is equal to a sum of reliability of each bit to be inverted.

By the way, even if CRC is executed on a decoded bit sequence with low reliability and no error is detected by executing CRC, in this case, as the possibility that the bit sequence is erroneous is high, for finding out a bit sequence having the probability that no error is included therein, it is reasonable to execute CRC in ascending order of sums of reliability for each bit sequence. Herein by executing bit inversion, reliability of the bit can be regarded as 0. For this reason, reliability of a bit sequence having been subjected to bit inversion becomes equal to a sum of reliability, of bits not having been subjected to bit inversion, and in Embodiment 1, to execute CRC in ascending order of reliability each bit sequence, bit inversion is executed in ascending order of sums of reliability.

Next description is made for Embodiment 2 of the error correcting/decoding apparatus according to the present invention.

Figure 4:
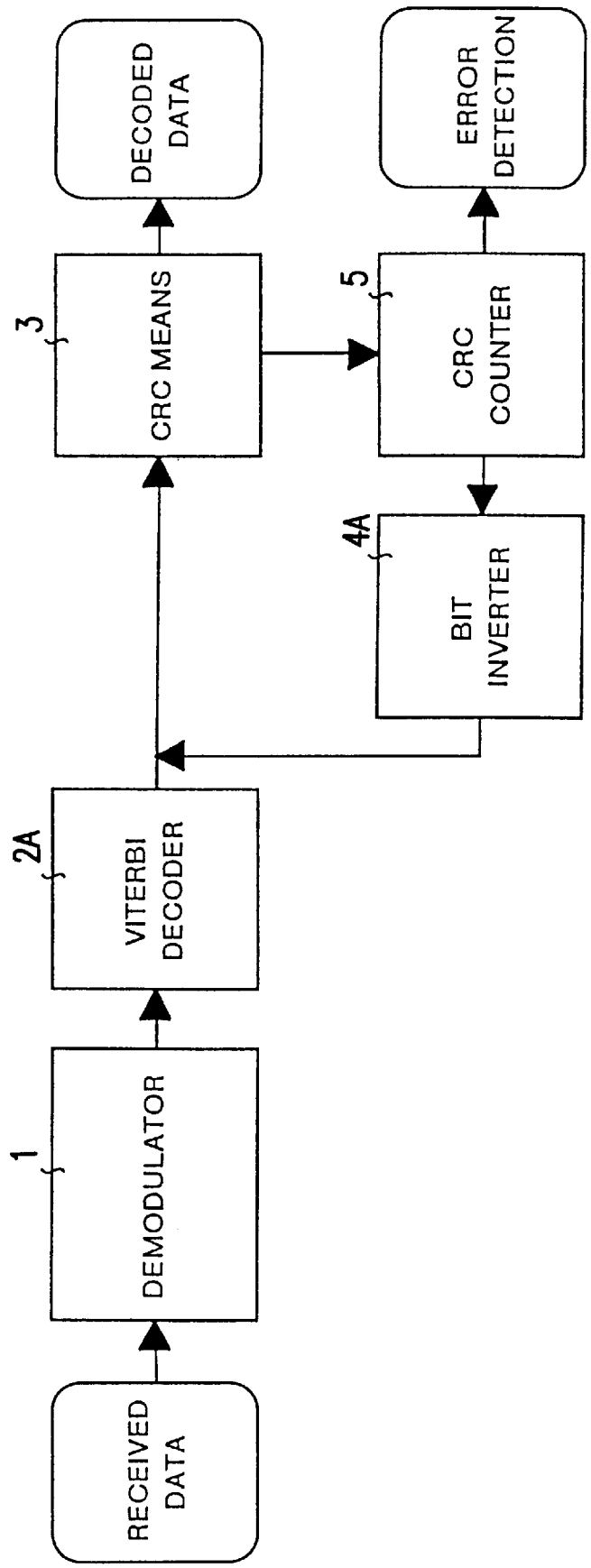
FIG. 4 is a block diagram showing the configuration of the error correcting/decoding apparatus according to Embodiment 2 of the present invention.

FIG. 4 is a block diagram showing Embodiment 2 of the error correcting/decoding apparatus according to the present invention. It should be noted that the same reference numeral is assigned to a component having the same function in Embodiment 1.

In this figure, designated at the reference numeral 1 is a demodulator, at 2 a Viterbi decoder, at 3 a CRC means, at 4A a bit inverter, at 5 a CRC counter for storing times j of CRC executed by the CRC means 3 (described as CRC times hereinafter) and also limiting times of CRC and bit inversion by determining whether the CRC times j has surpassed a preset upper limit times jmax of CRC or not.

Next description is made for operation.

Figure 5:
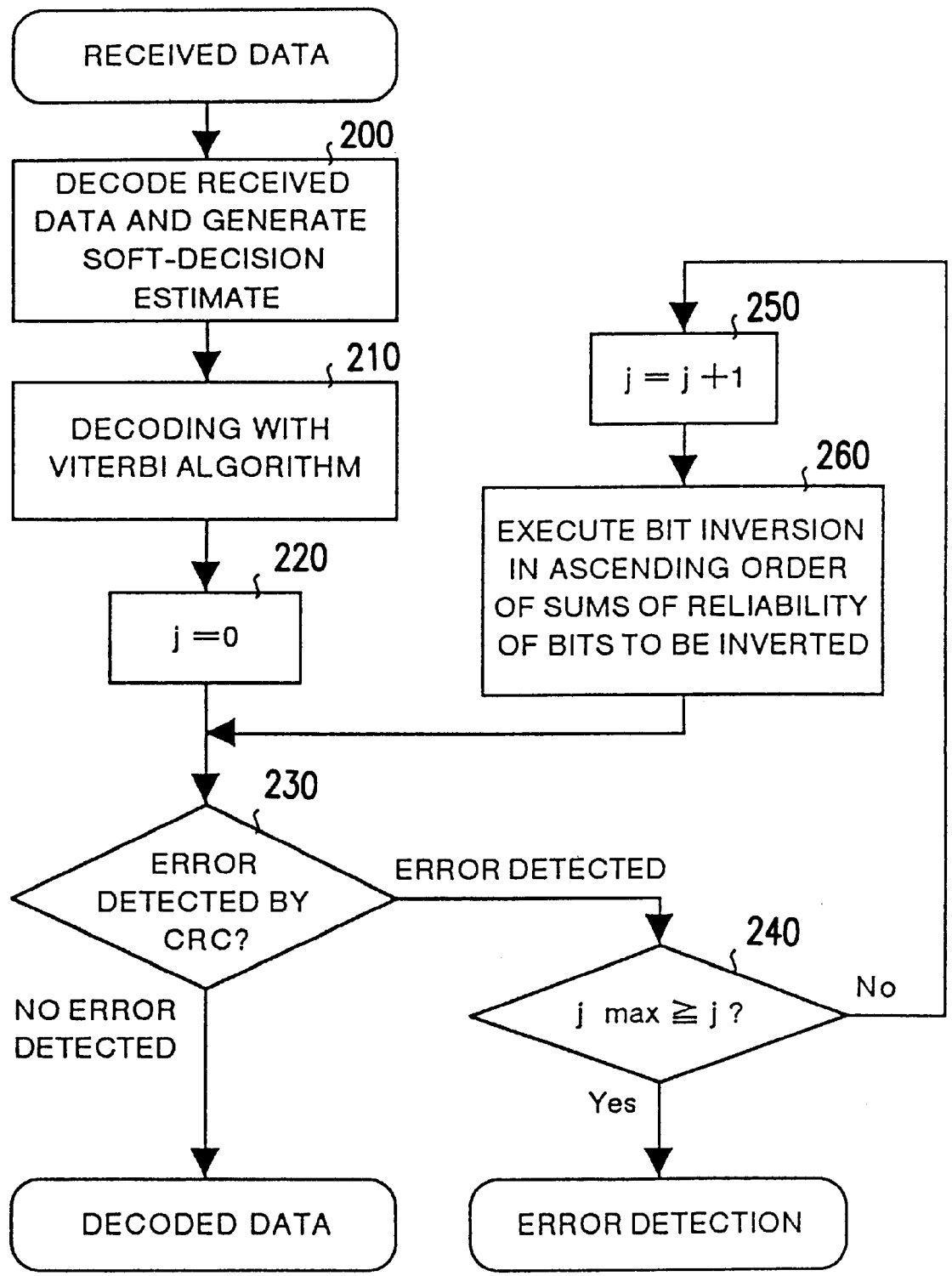
FIG. 5 is a flowchart showing the concatenated code error correcting/decoding method by the error correcting/ decoding apparatus according to Embodiment 2.

FIG. 5 is a flowchart showing a sequence of operations of the decoder according to Embodiment 2 of the present invention in the concatenated code error correcting/decoding method.

When received data is input into the demodulator, at first the demodulator demodulates the received data, and also computes a soft-decision estimate for the received signal from amplitude and a phase of the received signals (step 200). Then, the Viterbi decoder 2A selects a path with large path metrics according to the soft-decision estimate generated in the demodulator 1, and generates decoded data after traceback (step 210). Then, a difference in branch metrics used in the selecting operation is appended to each bit in the decoded bit sequence as reliability. It should be noted that the sequence up to this step is the same as that in Embodiment 1.

Next, in Embodiment 2, at first the CRC counter 5 sets 0 (zero) as an initial value of times j of CRC executed by the CRC means 3 (step 220), and then the CRC means 3 executes CRC on an input bit sequence (step 230).

And, as a result of CRC, when no error is detected (step 230) "No error detected"), this bit sequence is output as decoded data, and the decoding operation is terminated, and when any error is detected (step 230 "Error detected"), the CRC counter 5 further determines whether the current CRC times j has reached a preset and stored CRC upper limit times jmax or not (step 240), and when it is determined that the CRC times j has reached the CRC upper limit times jmax (step 240 "YES"), the decoding operation is terminated as error detection.

On the other hand, when the CRC times j is not equal to the CRC check upper limit times jmax, namely when the CRC times j is less than the CRC check upper limit times jmax (step 240 "NO"), the CRC counter 5 increments the CRC times j by 1 (step 250), and then like in Embodiment 1 described above, the bit inverter 4A executes bit inversion in ascending order of sums of reliability appended to bits to be inverted (step 260), and determination is made as to whether any error is present or not by executing the processing in step 230 again.

For the reasons as described above, with the error correcting/decoding apparatus according to this Embodiment 2 of the present invention, reliability is appended to each bit in a bit sequence decoded according to the Viterbi algorithm, and when any error is detected in error detection by means of CRC, CRC is repeated concurrently with bit inversion executed in ascending order of sums of reliability, and an output bit at the point of time when no error is detected is output as decoded data with the decoding operation terminated, so that, as in Embodiment 1, when only a few bits in the bit sequence decoded according to the Viterbi algorithm are erroneous, correction can be performed by bit inversion, which improves the error correcting capability. As for a work load for computing, a work load for the Viterbi decoding operation sharing a large portion of a decoding operation does not increase, and increase of the work is limited to that in CRC operations and addition of bit inversion operations, which is negligible as a whole.

Also in Embodiment 2, when any error is detected even if bit inversion and CRC are executed for a bit sequence up to a prespecified CRC upper limit times jmax, the bit inversion and CRC are not further repeated and the decoding operation is terminated as error detection, so that the number of bit inversion and CRC to be executed again when any error is detected by means of operations and a period of time required for the processing can be limited.

Next description is made for Embodiment 3 of the error correcting/decoding apparatus according to the present invention.

Figure 6:
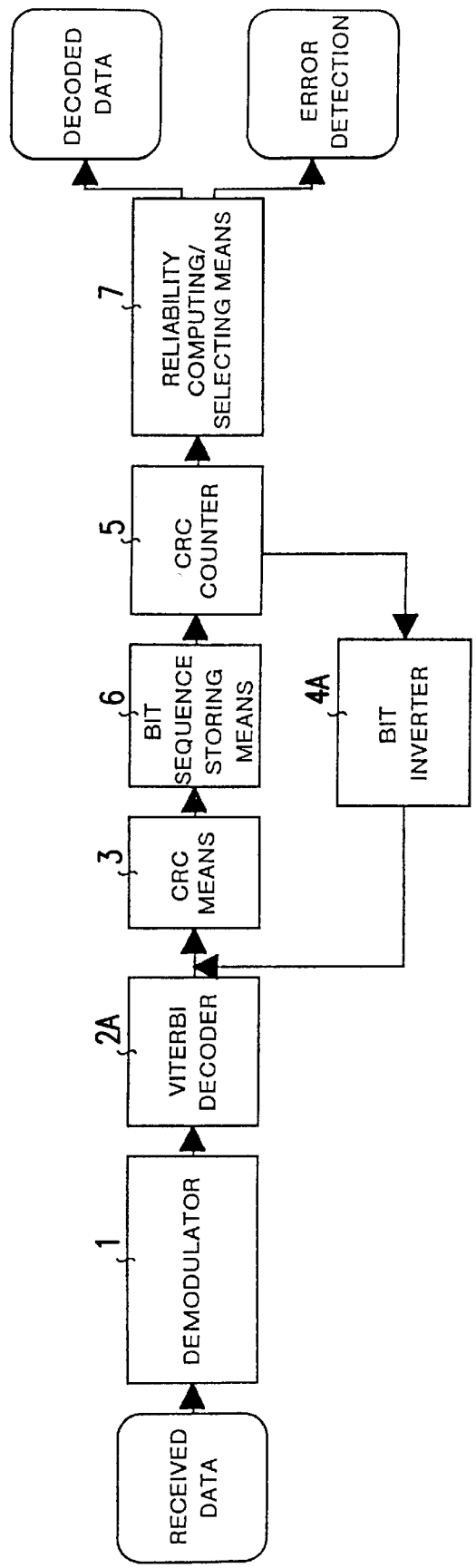
FIG. 6 is a block diagram showing the configuration of the error correcting/decoding apparatus according to Embodiment 3 of the present invention.

FIG. 6 is a block diagram showing Embodiment 3 of the error correcting/decoding apparatus according to the present invention. It should be noted that the same reference numeral is assigned to a component having the same function as that in Embodiment 1 or Embodiment 2 in the following description.

In the figure, designated at the reference numeral 1 is a demodulator, at 2A a Viterbi decoder, at 3 a CRC means, at 4A a bit inverter, at 5 a CRC counter, at 6 a bit sequence storing means for storing therein a bit sequence in which no error is detected by CRC as a candidate for decoded data, at 7 a reliability computing/selecting means for computing a sum of reliability of inverted bits in each bit sequence by comparing bit sequences each stored as a candidate for decoded data to original bit sequences before bit inversion and selecting a bit sequence with the smallest sum of reliability for inverted bits.

Next description is made for operation.

Figure 7:
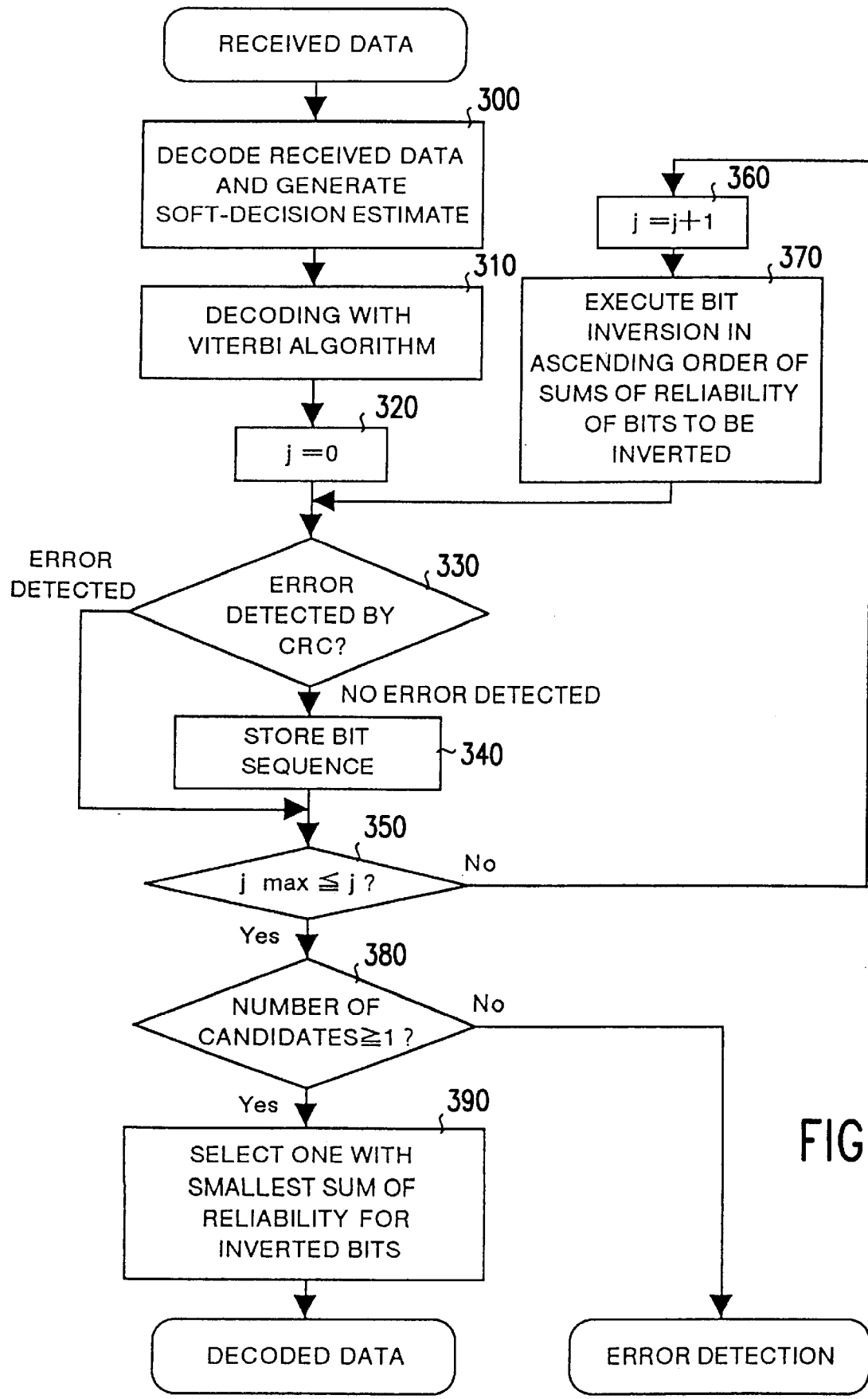
FIG. 7 is a flowchart showing the concatenated code error correcting/decoding method by the error correcting/decoding apparatus according to Embodiment 3.

FIG. 7 is a flowchart showing a sequence of operations of a decoder according to Embodiment 3 of the present invention in the concatenated code error correcting/decoding method.

When received data is input into the demodulator 1, the demodulator 1 demodulates the received data, and computes soft-decision estimate for a received signal from amplitude and a phase of the received signal (step 300), then the Viterbi decoder 2A selects a path with a large path metric according to the soft-decision estimate generated in the demodulator 1, and generates decoded data after traceback (step 310). In this step, a difference in branch metrics used in the selecting operation is appended to each bit in the decoded bit sequence as reliability.

Then, the CRC counter 5 is set to zero as an initial value of the CRC times j (step 320), and then the CRC means executes CRC on the input bit sequence (step 330). It should be noted that the sequence up to this step is the same as that in Embodiment 2 described above.

Herein in this Embodiment 3, only when no error is detected as a result of CRC by the CRC means 3 (step 330 "No error detected"), the bit sequence storing means 6 stores the bit sequence as a candidate for decoded data (step 340), and then the CRC counter 5 determines whether the CRC times j is not less than the CRC upper limit times jmax or not (step 350).

When the CRC times j is less than the CRC upper limit times jmax (step 350 "NO"), the CRC counter 5 increments the CRC times j by 1 (step 360), and then the bit inverter 4A executes bit inversion in ascending order of sums of reliability for bits to be inverted as in Embodiments 1 and 2 (step 370), and then system control returns to the error detection processing by CRC in the step 330, and the subsequent processing is executed.

As a result, the bit inverter 4A executes bit inversion by a prespecified CRC upper limit times jmax on a bit sequence obtained by decoding according to the Viterbi algorithm, and the CRC means 3 executes CRC by the CRC upper limit times jmax, and only when no error is detected by means of CRC in this step, the bit sequence storing means 6 stores the bit sequence as a candidate for decoded data.

When the CRC times j has reached the CRC upper limit times jmax (step 350 "YES"), determination is made as to presence of a bit sequence stored as a candidate for decoded data in the bit sequence storing means 6 (step 380), and when on bit sequence is stored as a candidate data for decoded data (step 380 "NO"), the decoding operation is terminated as error detection.

In contrast, when a bit sequence as a candidate for decoded data is stored in the bit sequence storing means 6 (step 380 "YES"), the reliability computing/selecting means 7 compares the bit sequence having been subjected to bit inversion and stored in the bit sequence storing means 6 to a bit sequence not having been subjected to bit inversion output from the Viterbi decoder 2A, computes a sum of reliability of inverted bits, selects and outputs a bit sequence with the smallest reliability as decoded data, and terminates the decoding operation. It should be noted that, when only one bit sequence is stored as a candidate in the bit sequence storing means 6, the bit sequence is output as decoded data without executing selection by obtaining a sum of reliability.

For the reasons as described above, with the error correcting/decoding apparatus according to this Embodiment 3 of the present invention, reliability is appended to each bit in a bit sequence decoded according to the Viterbi algorithm, CRC is executed by a prespecified times concurrently with bit inversion executed in ascending order of sums of reliability, a bit sequence in which no error is detected by means of CRC is stored as a candidate for decoded data, and when there are several candidates, a bit sequence with the smallest sum of reliability for inverted bits is output as decoded data, so that, when Viterbi decoding is erroneously executed for only several bits, the bits can easily be corrected, and decoded. data is selected according to reliability of bits having been subjected to bit inversion even if there are several bit sequences in each of which no error is detected by CRC after bit inversion, so that one with the highest reliability can be selected as decoded data from a set of candidates, and a decoding error ratio can be reduced as compared to those in Embodiments 1 and 2. As for a working load for computing, like in Embodiments 1 and 2 described above, a work load for Viterbi decoding operation sharing a large portion of decoding operation does not increase, and increase of the work load is limited to that in CRC operations and addition of a bit inverting operation, and for this reason increase in the work load as a whole is negligible.

Next description is made for Embodiment 4 of the error correcting/decoding apparatus according to the present invention.

Figure 8:
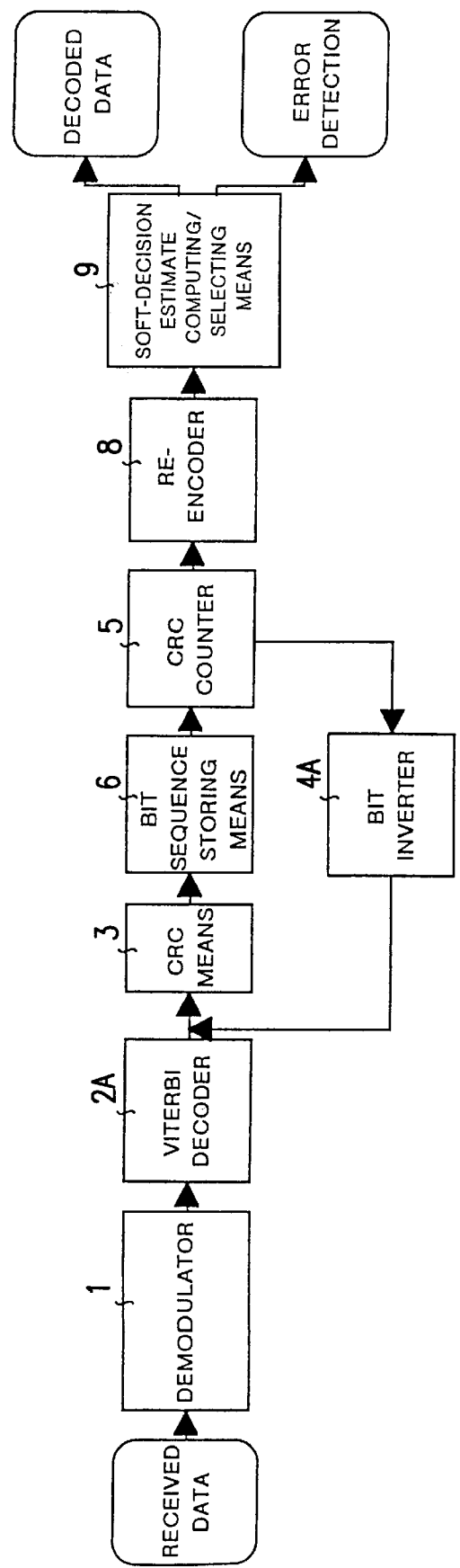
FIG. 8 is a block diagram showing the configuration of the error correcting/decoding apparatus according to Embodiment 4 of the present invention.

FIG. 8 is a block diagram showing configuration of the error correcting/decoding apparatus according to the fourth embodiment of the present invention. It should be noted that the same reference numeral is assigned to a component having the same function as that in Embodiments 1 to 3 described above.

In this figure, designated at the reference numeral 1 is a demodulator, at 2A a Viterbi decoder, at 3 a CRC means, at 4A a bit inverter, at 5 a CRC counter, at 6 a bit sequence storing means, at 8 a re-encoder for encoding a bit sequence with a convolution code, at 9 a soft-decision estimate computing/selecting means for obtaining a sum of soft-decision estimate for inverted bits by comparing bit sequences stored as a candidate and the original bit sequences and selecting a bit sequence with the smallest sum of soft-decision estimate for inverted bits.

Next description is made for operation.

Figure 9:
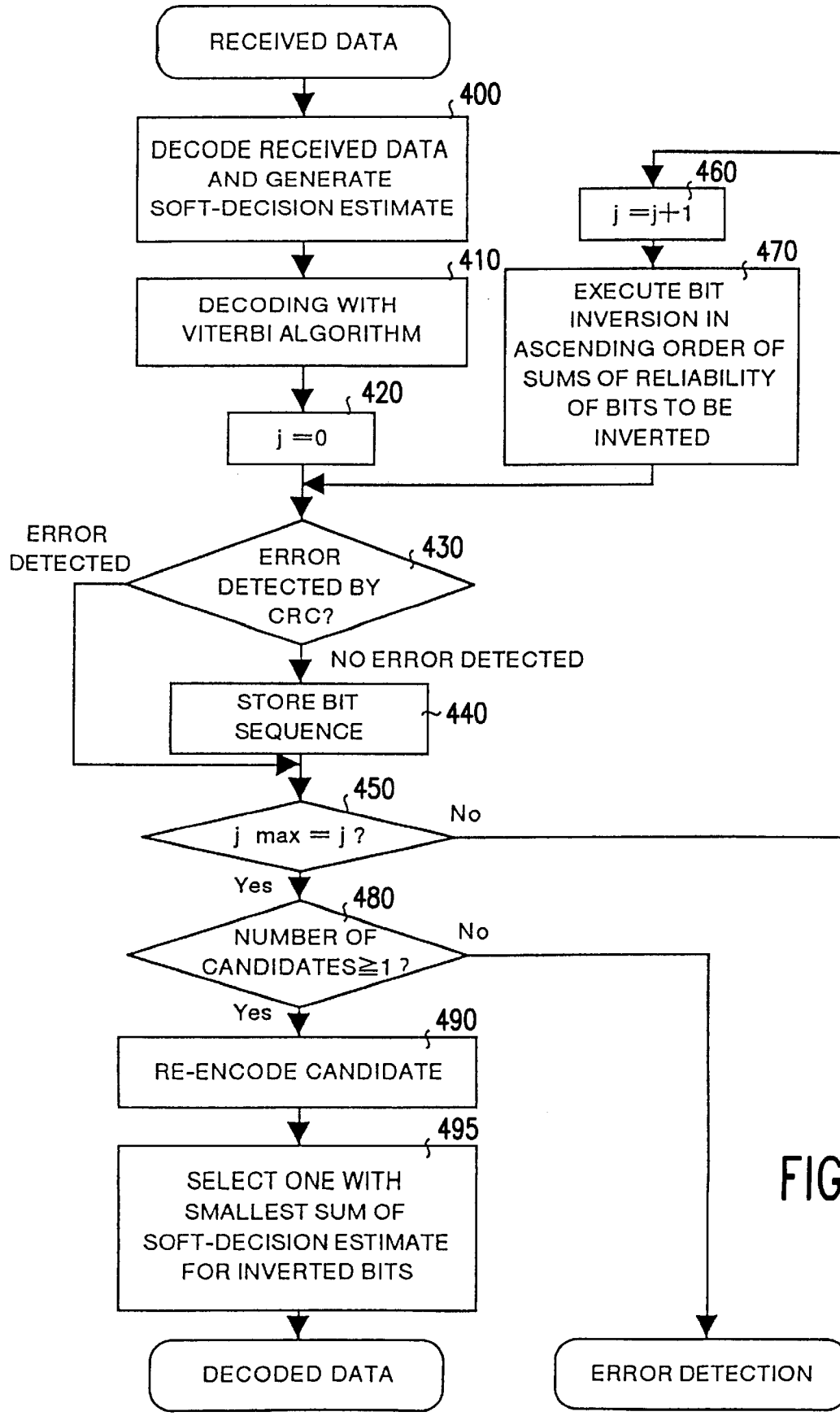
FIG. 9 is a flowchart showing the concatenated code error correcting/decoding method by the error correcting/decoding apparatus according to Embodiment 4.

FIG. 9 is a flowchart showing a sequence of operations of a decoder according to this Embodiment 4 of the present invention in the concatenated error correcting/decoding method. It should be noted that the processing sequence from step 400 to step 408 in FIG. 9 is the same as the processing sequence from step 300 to step 380 in Embodiment 3 described above and shown in FIG. 7, and description is made below for the processing sequence from the step 480 and on.

Namely, when determination is made as to whether a bit sequence as a candidate for decoded data is stored in the bit sequence storing means 6 (step 480), when it is determined that a bit sequence as a candidate for decoded data is stored in the bit sequence storing means 6 (step 480 "YES"), at first the re-encoder 8 encodes the bit sequence stored in the bit sequence storing means 6 to a convolution code (step 490), and then the soft-decision estimate computing/selecting means 9 compares received data to a bit sequence re-encoded by the re-encoder 8 to obtain a sum of soft-decision estimate for inverted bits, selects a bit sequence with the smallest sum of soft-decision estimate for inverted bits, and outputs the bit sequence as decoded data (step 495).

For the reasons as described above, with the error correcting/decoding apparatus according to this Embodiment 4 of the present invention, reliability is appended to each bit in a bit sequence decoded according to the Viterbi algorithm, CRC is executed a prespecified number of times concurrently with bit inversion executed in ascending order of sums of reliability, a bit sequence in which no error is detected by CRC is stored as a candidate for decoded data, and when there are a set of candidates, when comparing each candidate bit sequence re-encoded with convolution code to received data, a bit sequence with the smallest sum of reliability of inverted bits is output as decoded data with the decoding operation terminated, and when there are no candidates, signal processing is executed to terminate the decoding operation, so that, when only several bits are erroneous in a bit sequence decoded by Viterbi decoder, the erroneous bits can be corrected by means of bit inversion, which insures the improved error correcting capability. As for a work load for computing, a work load for Viterbi decoding operation sharing a large portion of a decoding operation does not increase, and increase in the work load for computing is limited to that in the CRC operation and addition of an bit inverting operation, so that increase in the work load as a whole is negligible.

Also in Embodiment 4, when there are a set of candidates, each candidate is re-encoded with convolution code, so that, although additional work load and time for re-encoding are required, the probability of selecting a correct candidate becomes higher as compared to that in Embodiment 3 where re-encoding is not performed.

Next description is made for Embodiment 5 of the error correcting/decoding apparatus according to the present invention.

Figure 10:
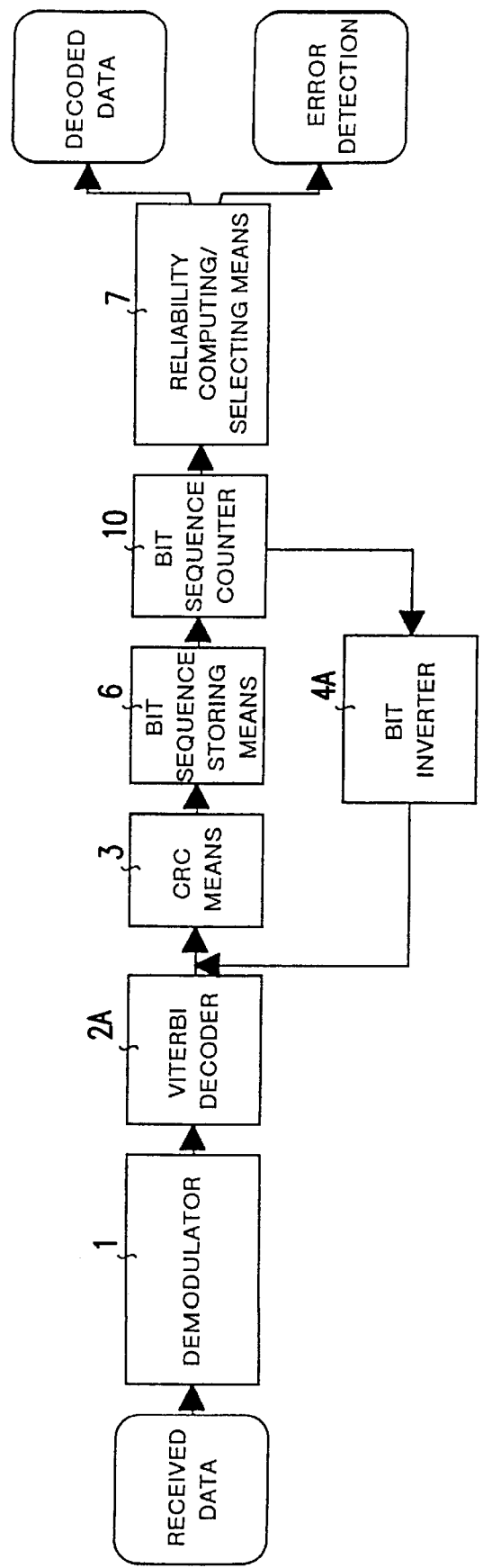
FIG. 10 is a block diagram showing configuration of the error correcting/decoding apparatus according to Embodiment 5 of the present invention.

FIG. 10 is a block diagram showing Embodiment 5 of the error correcting/decoding apparatus according to the present invention. In this figure, the same reference numeral is assigned to a component having the same function as that in Embodiments 1 to 4.

In the figure, designated a the reference numeral 1 is a demodulator, at 2A a Viterbi decoder, at 3 a CRC means, at 4A a bit inverter, at 5 a CRC means, at 6 a bit sequence storing means, at 7 a reliability computing/selecting means, at 10 a bit sequence counter for counting the number k of candidate bit sequences stored as candidates for decoded data in the bit sequence storing means 6 and making the bit inverter 4A or CRC means 3 execute bit inversion or CRC until the number k of candidates reaches the prespecified upper limit number kmax of candidates.

Next description is made for operation.

Figure 11:
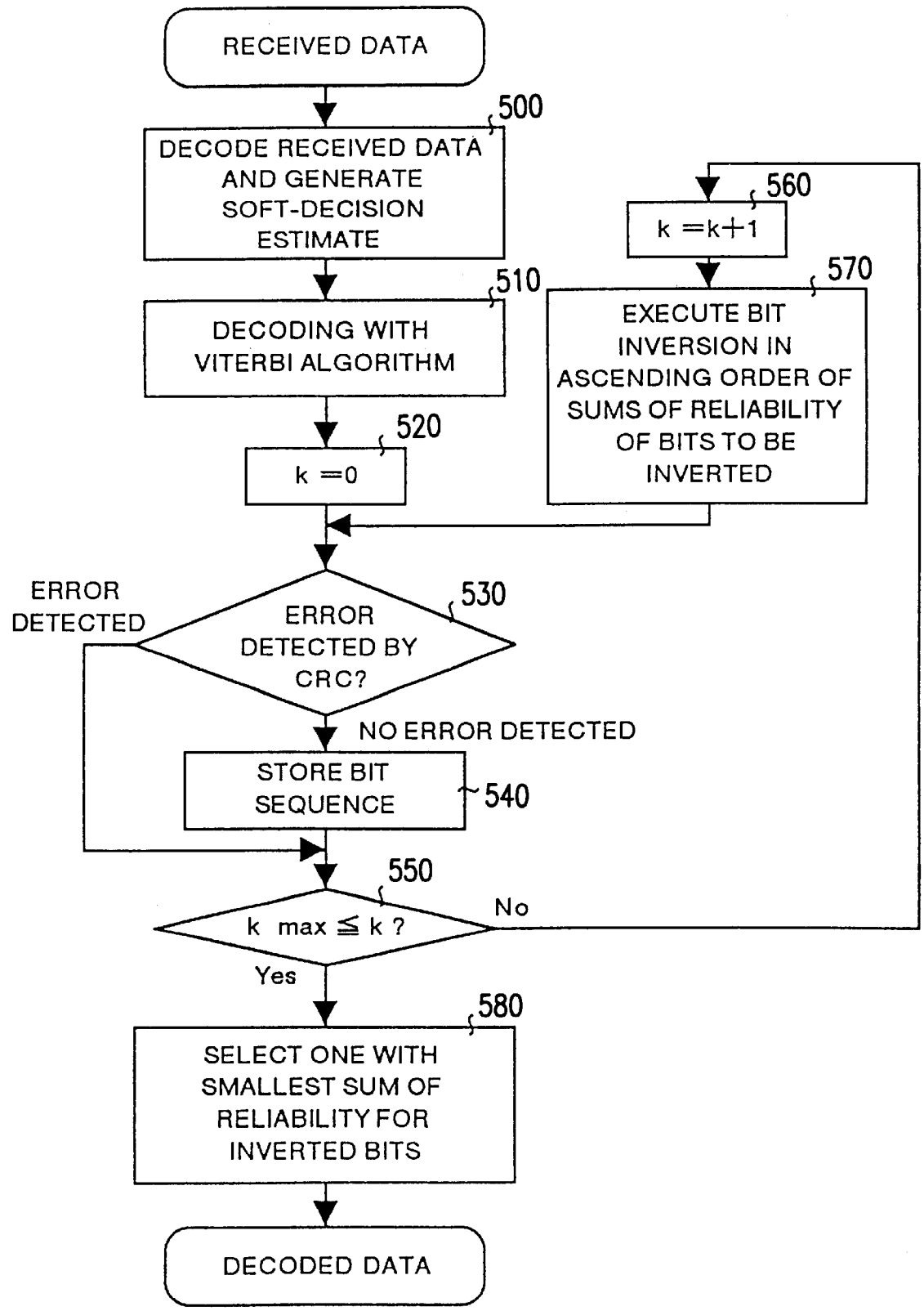
FIG. 11 is a flowchart showing the concatenated code error correcting/decoding method by the error correcting/decoding apparatus according to Embodiment 5.

FIG. 11 is a flowchart showing a sequence of operations of the decoder according to Embodiment 5 in the concatenated code error correcting/decoding method.

When received data is input into the demodulator 1, at first the demodulator 1 demodulates the received data, computes soft-decision estimate for a received signal from amplitude and a phase of the received signal (step 500), then the Viterbi decoder 2A selects a path with large path metrics according to the soft-decision estimate generated in the demodulator 1, and generates decoded data after traceback (step 510). Then, a difference in branch metric used in the selecting operation is appended as reliability to each bit in the decoded bit sequence.

Then the bit sequence counter 10 sets 0 (zero) as an initial value of the number k of candidates (step 520), then the CRC means 3 executes CRC to the input bit sequence (step 530), as a result of CRC, only when no error is detected (step 530 "No error detected"), the bit sequence is stored as a candidate for decoded data (step 540), then the bit sequence counter 10 makes determination as to whether the number k of candidate bit sequences stored as candidates for decoded data. has reached the specified upper limit number kmax of candidates (step 550).

Then, when the number k of candidates has not reached the upper limit number kmax of candidates (step 550 "NO"), like in Embodiment 4 or other embodiments described above, the bit sequence counter 10 increments the number k of candidates by 1 (step 570), then the bit inverter 4A executes bit inversion in ascending order of sums of reliability of each bit like in Embodiments 1 to 4 (step 560), and then system control returns to the error detection processing by CRC in the step 530, and the subsequent processing is executed.

As a result, bit inversion and CRC are executed until bit sequences are stored in the bit sequence storing means 6 up to the prespecified candidate upper number kmax.

Then, when the number k of candidates stored in the bit sequence storing means 6 has reached the upper limit number kmax of candidates (step 550 "YES"), then the reliability computing/selecting means 7 compares the bit sequence output from the Viterbi decoder 2A to the bit sequence stored as a candidate, obtains a sum of reliability of inverted bits, selects a bit sequence with the smallest sum of reliability, outputs the bit sequence as decoded data (step 580), and then terminates decoding operation.

For the reasons as described above, with the error correcting/decoding apparatus according to Embodiment 5 of the present invention, reliability is appended to each bit in a bit sequence decoded according to the Viterbi algorithm, CRC is further repeated concurrently with bit inversion executed in ascending order of sums of reliability, bit sequences in each of which no error is detected are stored as candidates for decoded data by the upper limit number kmax, and then a bit sequence with the smallest sum of reliability for inverted bits is selected as decoded data, so that, when only several bits are erroneous in a bit sequence decoded by Viterbi decoder, the bits can be corrected by means of bit inversion, and for this reason the error correcting capability is improved and a candidate with the smallest sum of reliability is selected from a some of candidates for decoded data, so that the decoding error ratio can be reduced. As for a work load for computing, the work load for Viterbi decoding operation sharing a large portion of a decoding operation does not increase, and increase in the work load is limited to that in the CRC operation and addition of a bit inverting operation, which is negligible as a whole.

Next description is made for Embodiment 6 of the error correcting/decoding apparatus according to the present invention.

Figure 12:
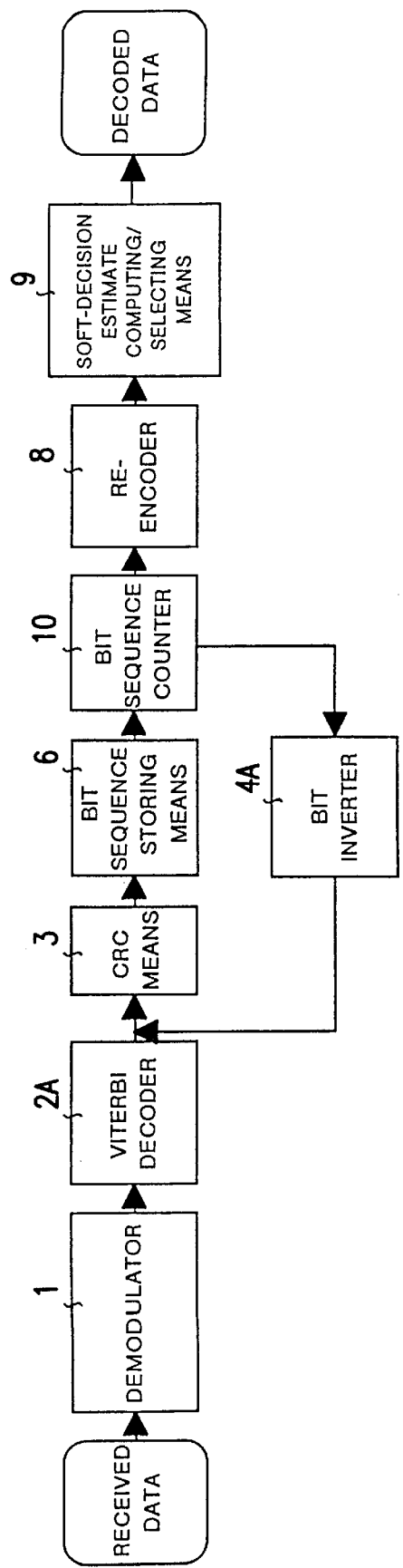
FIG. 12 is a block diagram showing the configuration of the error correcting/decoding apparatus according to Embodiment 6 of the present invention.

FIG. 12 is a block diagram showing configuration of the error correcting/decoding apparatus according to this embodiment of the present invention. It should be noted that, in the following description, the same reference numeral is assigned to a component having the same function as that in Embodiments 1 to 5.

In this figure, designated at the reference numeral 1 is a demodulator, at 2A a Viterbi decoder, at 3 a CRC means, at 4A a bit inverter, at 6 a bit sequence storing means, at, 8 a re-encoder, at 9 a soft-decision estimate computing/selecting means, and at 10 a bit sequence counter.

Next description is made for operation.

Figure 13:
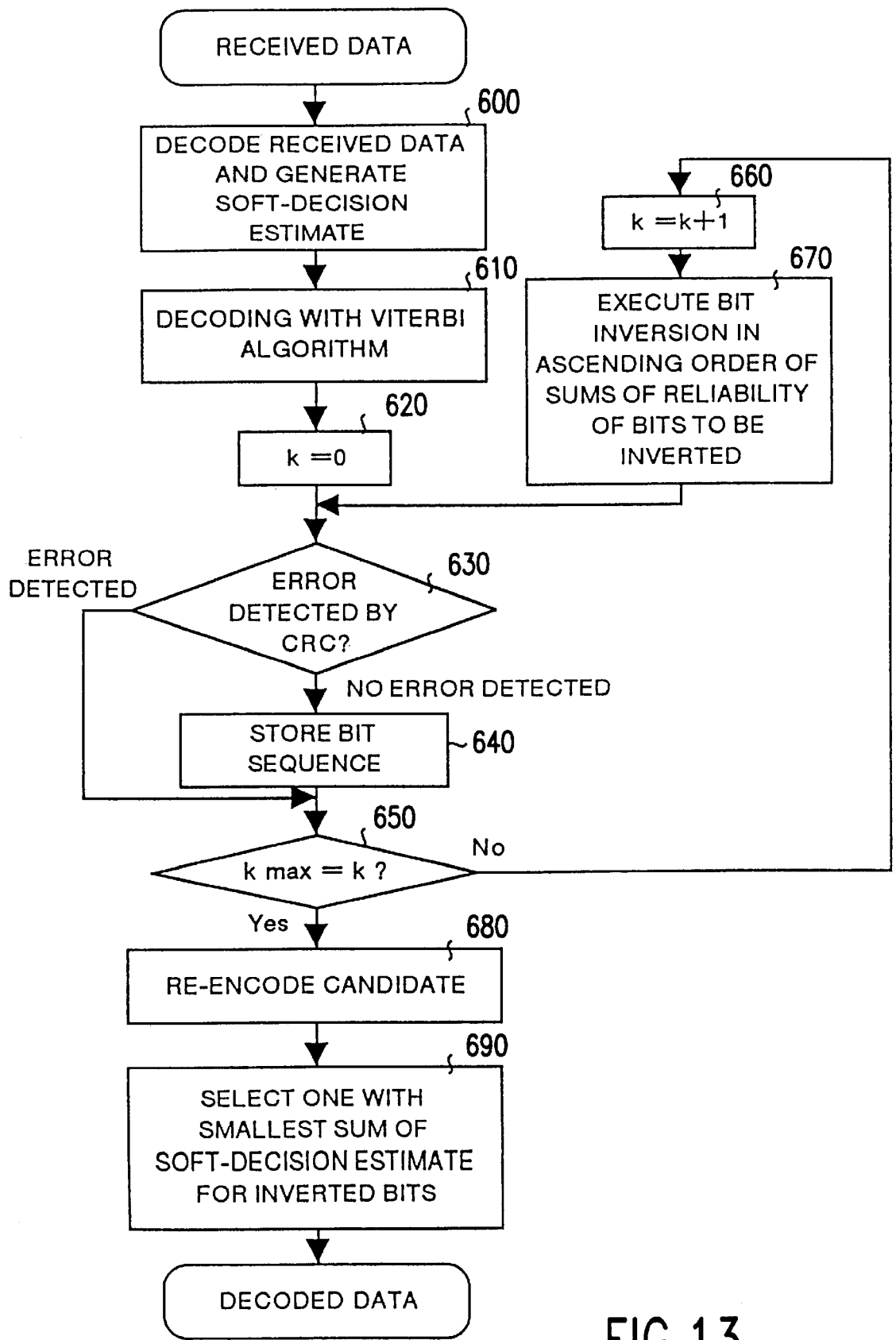
FIG. 13 is a flowchart showing the concatenated code correcting/decoding method by the error correcting/decoding apparatus according to Embodiment 6.

FIG. 13 is a flowchart showing a sequence of operations of the decoder according to Embodiment 6 of the present invention in the concatenated code error correcting/decoding method. It should be noted that the processing sequence from step 600 to step 670 in Embodiment 6 is the same as the processing sequence from step 500 to step 570 in Embodiment 5 shown in FIG. 11, so that description thereof is omitted herein.

Namely, when determination is made by the bit sequence counter 10 as to whether the number of K of candidate bit sequences stored as candidates for decoded data has reached the prespecified upper limit number kmax of candidates (step 650), when it is determined that the number k of candidates has reached the prespecified upper limit number kmax of candidates (step 650 "YES"), in this Embodiment 6, at first the re-encoder 8 encodes a stored bit sequence stored in the bit sequence storing means 6 into convolution code (step 680), then the soft-decision estimate computing/selecting means 9 compares received data to the bit sequence encoded by the re-encoder 8 to obtain a sum of soft-decision estimate for inverted bits, selects a bit sequence with the smallest sum of soft-decision estimate for inverted bits, outputs the bit sequence as decoded data (step 690), and then terminates the decoding operation.

For the reasons as described above, with the error correcting/decoding apparatus according to this Embodiment 6 of the present invention, reliability is appended to each bit in a bit sequence decoded according to the Viterbi algorithm, further CRC is executed concurrently with bit inversion executed in ascending order of sums of reliability, the prespecified number of bit sequences, in each of which no error is detected, are stored as candidates for decoded data, and when bit sequences obtained by re-encoding each candidate are compared to received data, and a bit sequence with the smallest sum of soft-decision estimate for inverted bits is output as decoded data with the decoding operation terminated, so that, when only several bits are erroneous in a bit sequence decoded by Viterbi decoder, the bits can be corrected by means of bit inversion, and for this reason the error correcting capability is improved. As for a work load for computing, a work load for a Viterbi decoding operation sharing a large portion of a decoding operation does not increase, and increase in the work load is limited to increase in a CRC operation and addition of an bit inverting operation, and increase in the work load as a whole is negligible.

Next description is made for Embodiment 7 of the error correcting/decoding apparatus according to the present invention.

Figure 14:
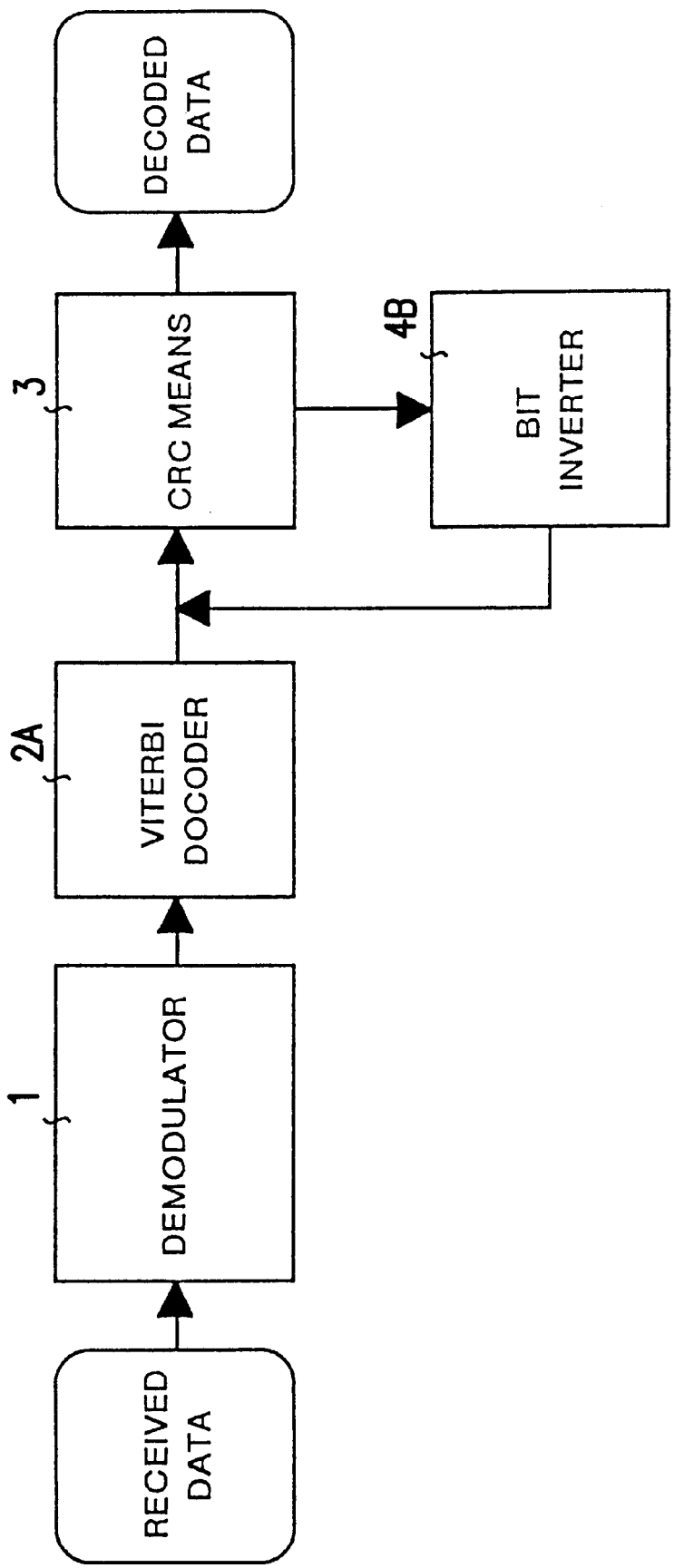
FIG. 14 is a block diagram showing the configuration of the error correcting/decoding apparatus according to Embodiment 7 of the present invention.

FIG. 14 is a block diagram showing configuration of Embodiment 7 of the error correcting/decoding apparatus according to the present invention.

In this figure, designated at the reference numeral 1 is a demodulator, at 2A a Viterbi decoder, at 3 a CRC means, at 4B a bit inverter for executing bit inversion in ascending order of binary numbers regarding a bit with the minimum reliability as a lowest bit and bit with the maximum reliability as a highest bit.

Next description is made for operation.

Figure 15:
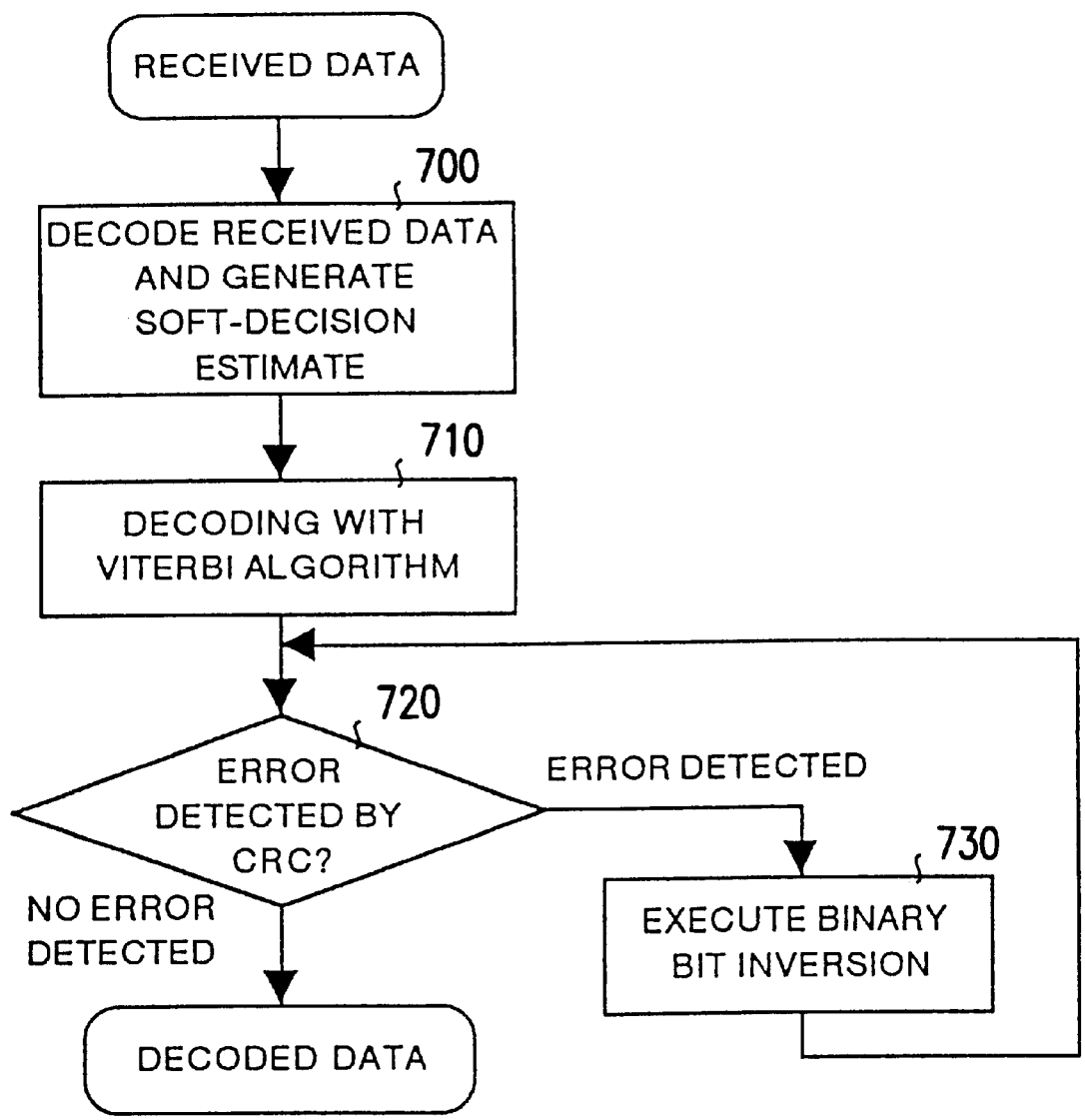
FIG. 15 is a flowchart showing the concatenated code error correcting/decoding method by the error correcting/decoding apparatus according to Embodiment 7.
Figure 17:
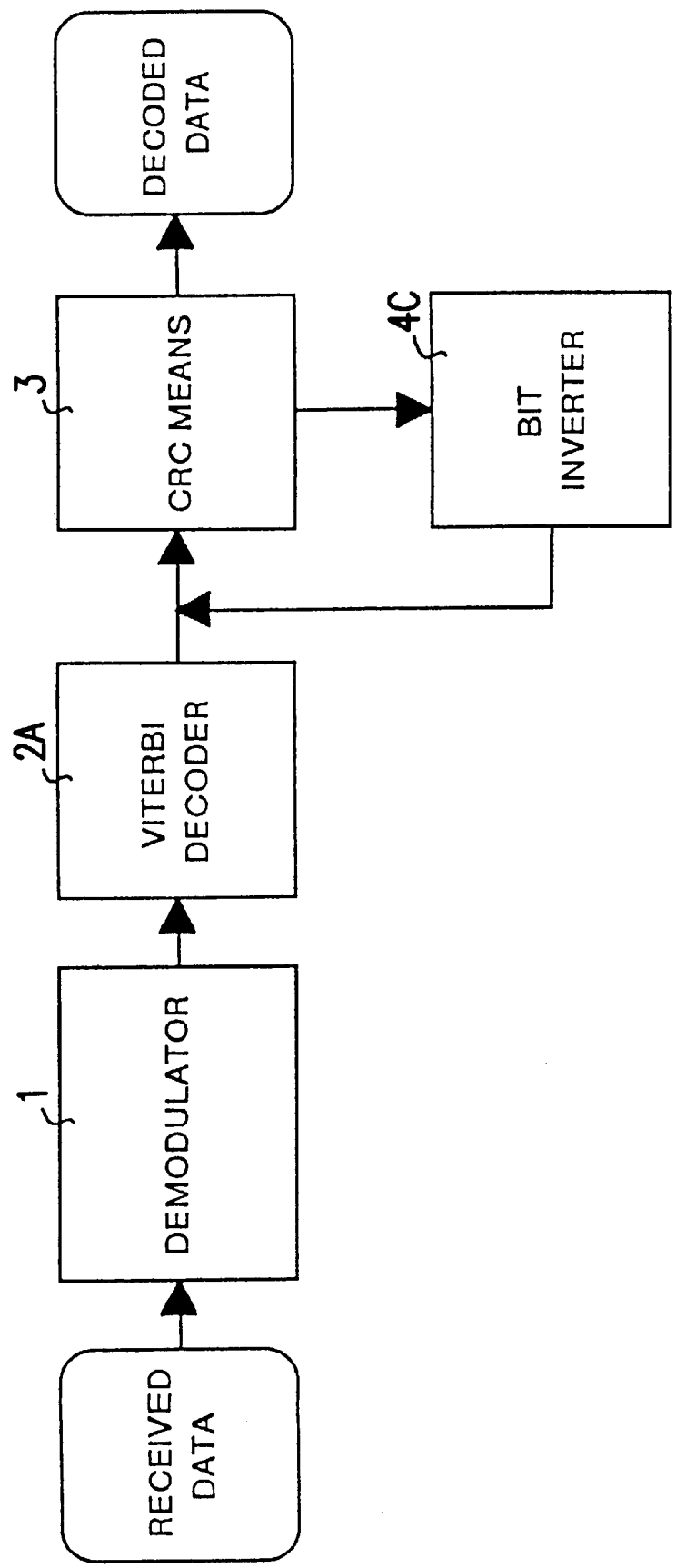
FIG. 17 is a block diagram showing configuration of the error correcting/decoding apparatus according to Embodiment 8 of the present invention.

FIG. 15 is a flowchart showing a sequence of operations of a decoder according to Embodiment 7 of the present invention in the concatenated code error correcting/decoding method.

When received data is input into the demodulator 1, at first the demodulator 1 demodulates the received data, and also computes soft-decision estimate for a received signal from amplitude and a phase of the received signal (step 700). Then, the Viterbi decoder 2A selects a path with large path metrics according to the soft-decision estimate generated by the demodulator 1, and generates decoded data after traceback (step 710). Then a difference in branch metrics used for the selecting operation is appended to each bit in the decoded bit sequence.

Then the CRC means 3 checks whether any error is present or not by executing CRC on the input bit sequence (step 720), and when no error is detected as a result of CRC (step 720 "No error detected"), the bit sequence is output as decoded data with the decoding operation terminated. The operating sequence up to this step is the same as that in Embodiment 1 described above.

In contrast, when an error is detected as a result of CRC (step 720 "Error detected"), in this Embodiment 7, the bit inverter 4B executes binary bit inversion of binary numbers on the bit sequence obtained by decoding according to the Viterbi algorithm, said binary numbers expressed by regarding a bit with the smallest reliability as the lowest bit and a bit with the largest reliability as the highest bit (step 730), and again inputs the bit sequence into the CRC means to be subjected to the processing in step 720 therein, and the processing in this step 730 is repeated until no error is detected by the CRC means 3.

Herein the binary bit inversion by the bit inverter 4B means that, for a data length of reliability of 4 bits, 1 indicates a position where a bit is inverted and 0 indicates a position where a bit is not inverted, the binary number increases as follows: (0000)→(0001)→(0010)→(0011)→(0100)→(0101)→(0110)→(0111)→(1000)→(1001)→(1010)→(1011)→(1100)→(1101)→(1110)→(1111).

FIG. 16 indicates specific method of bit inversion by the bit inverter 4B in Embodiment 7 of this invention.

In this figure, like in Embodiment 1 shown in FIG. 3, it is assumed that two bit sequences of "00000" and "01101" are received and both the two bit sequences have the reliability of "35241".

Then, in this Embodiment 7, the bit inverter 4B executes binary bit inversion of binary numbers on a bit sequence obtained by decoding according to the Viterbi algorithm regarding the 5th bit from the left end with the smallest reliability as the lowest bit, the 3rd bit, 1st bit, and 4th bit each from the left end as bits with successively larger reliability and regarding the 3rd bit from the left end as the highest bit.

Namely, in FIG. 16, in a case of, for instance, the bit sequence of "01101", in the first bit inversion, the 5th bit from the left end with the priority of 1 is subjected to bit inversion and converted to "01100", and in the second bit inversion, the 3rd bit from the left end with the priority of 2, which is expressed as "10" in the binary number form, is subjected to bit inversion and converted to "01001"; in the third bit inversion the 3rd and 5th bits from the left ends with the priority of 1 and 2 respectively, which are both "11" as a binary number, are subjected to bit inversion and converted to "01000"; in the fourth bit inversion, the 1st bit from the left end with the priority of 3, which is "11" as a binary number, is subjected to bit inversion and converted to "11101"; and in the fifth bit inversion, the 1st bit and 5th bit from the left end with the priority of 1 and 3 respectively, which are both "100" as a binary number, are subjected to bit inversion and converted to "11100".

For the reasons as described above, with the error correcting/decoding apparatus according to Embodiment 7 of the present invention, when bit inversion is to be executed, bit inversion is executed in ascending order of binary numbers regarding a bit with the smallest reliability as the lowest bit and a bit with the largest reliability as the highest bit, so that, although a sequence of bit inversion is different from that when bit inversion is executed in ascending order of sums of reliability, in a case only a few bits are erroneous in a bit sequence decoded by Viterbi decoder, the bits can be corrected by means of bit inversion, which insures the improved error correcting capability. As for a work load for computing, increase in the work load for a Viterbi decoding operation sharing a large portion of the CRC operation does not increase, and increase in the work load for computing is limited to that in the CRC operations as well as to addition of the bit inverting operation, so that increase in the work load for computing as a whole is negligible.

It should be noted that the above description assumes that the bit inverter 4A in the error correcting/decoding apparatus according to Embodiment 1 is changed to the bit inverter 4B, but in the present invention, the bit inverter 4A in the error correcting/decoding apparatus according to Embodiments 2 to 6 may be changed to the bit inverter 4B in Embodiment 7, and the same effect as that in Embodiment 2 to 6 can be achieved.

Next description is made for Embodiment 8 of the error correcting/decoding apparatus according to the present invention.

FIG. 16 is a block diagram showing configuration of the error correcting/decoding apparatus according to Embodiment 8 of the present invention. It should be noted that, in this embodiment, the same reference numerals are assigned to the same functions corresponding to those in each configuration according to the other embodiments described above.

In this figure, designated at the reference numeral 1 is a demodulator, at 2A a Viterbi decoder, at 3 a CRC means, and at 4C a bit inverter for executing bit inversion in ascending order of a sum of bits to be inverted, but in ascending order of a sum of reliability for bits to be inverted when a sum of bits to be inverted is equal.

Next description is made for operation.

Figure 18:
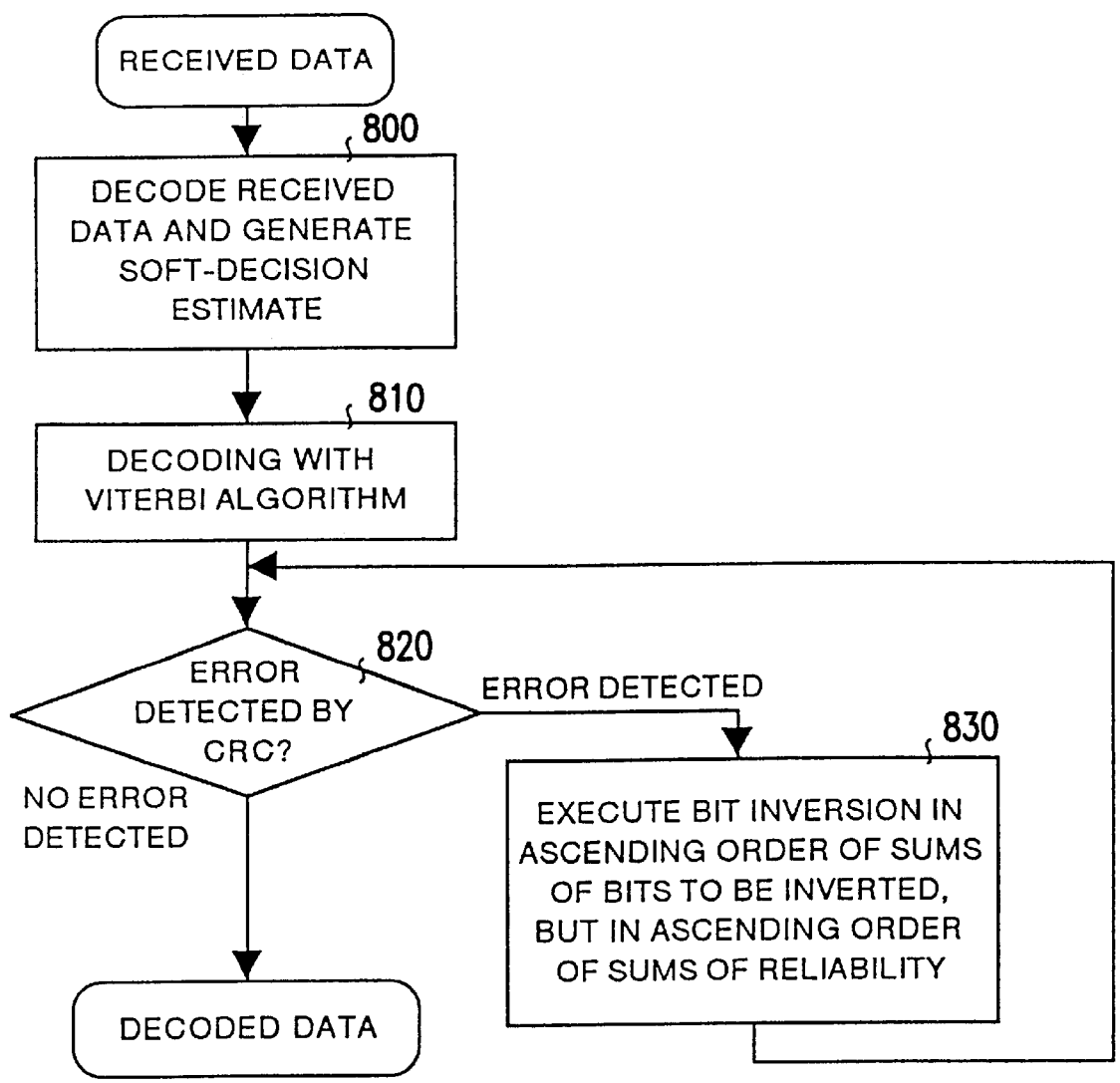
FIG. 18 is a flowchart showing the concatenated code error correcting/decoding method by the error correcting/decoding apparatus according to Embodiment 8.

FIG. 18 is a flowchart showing a sequence of operations by a decoder in the concatenated code error correcting/decoding method in Embodiment 8 of the present invention.

When received data is input into the demodulator 1, at first the demodulator 1 demodulates the received data, and also computes soft-decision estimate for a received signal from amplitude and a phase of the received signal (step 800), then, the Viterbi decoder 2A selects a path with a large path metrics according to the soft-decision estimate generated in the demodulator 1, and decoded data after traceback is generated (step 810). Then, a difference in branch metrics used in the selecting operation is appended to each bit in the decoded bit sequence as reliability.

Then, checking is executed as to whether any error is included or not by executing CRC on a bit sequence input from the CRC means 3 (step 820), and as a result of the CRC, when no error is detected ("No error detected" in step 820), the bit sequence is output as decoded data and the decoding operation is terminated. It should be noted that the processing up to this step is the same as those in Embodiment 1 and 7.

In contrast, when any error is detected ("Error detected" in step 820) as a result of the CRC, in Embodiment 8, the bit inverter 4C executes bit inversion on a bit sequence obtained by executing decoding operation according to the Viterbi algorithm in ascending order of sums of bits to be inverted, but in ascending order of sums of reliability for a bit to be inverted when sums of bits to be inverted are equal (step 830), the bit sequence with the bits to be subjected to inversion is input again to the CRC means 3 to make it execute the processing in step 820, and the bit inverting processing in this step 830 is repeated until no error is detected by the CRC means 3.

(a) and (b) in FIG. 19 show an example of a bit inversion sequence in the bit inverter 4C in Embodiment 8 respectively.

In this figure, as is a case of Embodiment 1 shown in FIG. 3, two bit sequences of "00000" and "01101" are subjected to bit inversion, and reliability is "35241" in both cases.

(a) in FIG. 19 shows a method of executing bit inversion in which bit inversion is usually executed in ascending order of sums of bits to be inverted, in ascending order of sums of reliability of bits to be inverted when the number of bits is equal, and also bit inversion is executed further in ascending order of reliability when sums of reliability are equal, but in an arbitrary order when the priority is not decided even after the operations are done as described above.

(b) in FIG. 19 shows a method of executing bit inversion in which bit inversion is usually executed in ascending order of sums of bits to be inverted, in ascending order of sums of reliability of bits to be inverted when the number of bits is equal, and also bit inversion is executed in an arbitrary order, namely in the order of priority put on the left side bit in this example when sums of reliability are equal.

For this reason, in a case of a bit sequence of "00000", if the bit inversion orders are 8th and 9th, the bit inversion is executed in ascending order of reliability when sums of reliability are equal in a case of the method shown in (a) in FIG. 19, so that bit inversion is executed in the order of "00011", "10100", but in a case of the method shown in (b) in FIG. 19, bit inversion is executed in the order of priority put on the left side bit when sums of reliability are equal, so that the bit inversion is executed in the order of "10100", "00011".

Accordingly, with the error correcting/decoding apparatus in Embodiment 8, when bit inversion is to be executed, bit inversion is executed in ascending order of sums of bits to be inverted, but in ascending order of sums of reliability of bits to be inverted when sums of bits to be inverted are equal, so that, when errors only in some bits are detected in the bit sequence decoded by a Viterbi decoding operation, the errors can be corrected by means of bit inversion, thus error correcting capability being improved. In addition, as far as a work load for computing is concerned, a work load for computing of Viterbi decoding operation sharing a large portion of the encoding operation does not increase, and increase in the work load for computing is limited to that in the CRC operation as well as to addition of bit inverting operations, and for this reason increase in the work load for computing is negligible as a whole.

It should be noted that, in Embodiment 8, the error correcting/decoding apparatus according to Embodiment 1 has been described with configuration in which the bit inverter 4A is replaced with the bit inverter 4C, however, in the present invention, the bit inverter 4A in the error correcting/decoding apparatus according to any of Embodiments 2 to 6 may be replaced to the bit inverter 4C in Embodiment 8. In this case, although the operations are not described in detail, each processing in step 260 in FIG. 5, step 370 in FIG. 7, step 470 in FIG. 9, step 570 in FIG. 11, and in step 670 in FIG. 13 as bit inversion processing in Embodiments 2 to 6 respectively is replaced with the processing in step 830 in Embodiment 8 shown in FIG. 18.

Next description is made for Embodiment 9 of the error correcting/decoding apparatus according to the present invention.

Figure 20:
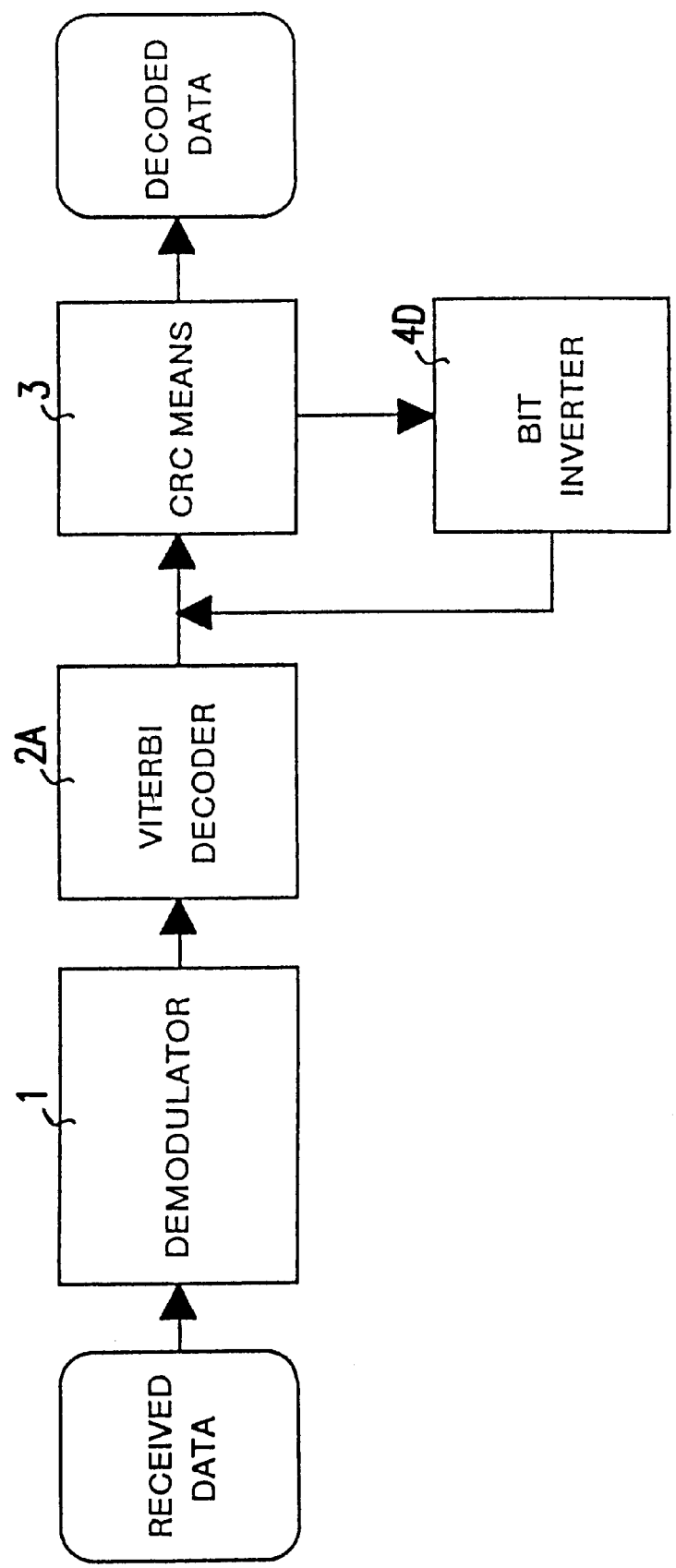
FIG. 20 is a block diagram showing the configuration of the error correcting/decoding apparatus according to Embodiment 9 of the present invention.

FIG. 20 is a block diagram showing configuration of the error correcting/decoding apparatus according to Embodiment 9 of the present invention. It should be noted that, in this embodiment, the same reference numerals are assigned to the same functions corresponding to those in each configuration according to the other embodiments described above.

In this figure, designated at the reference numeral 1 is a demodulator, at 2A a Viterbi decoder, at 3 a CRC means, and at 4D a bit inverter for executing bit inversion in ascending order of a sum of bits to be inverted or in an arbitrary order (in Embodiment 9, for instance, in order of priority put on the left side bit) of a sum of bits when a sum of bits to be inverted is equal. It should be noted that, in Embodiment 9, the bit inverter 4D does not use reliability in the bit inversion, so that the Viterbi decoder 2A may not append reliability to each bit when decoding operation is executed.

Next description is made for operation.

Figure 21:
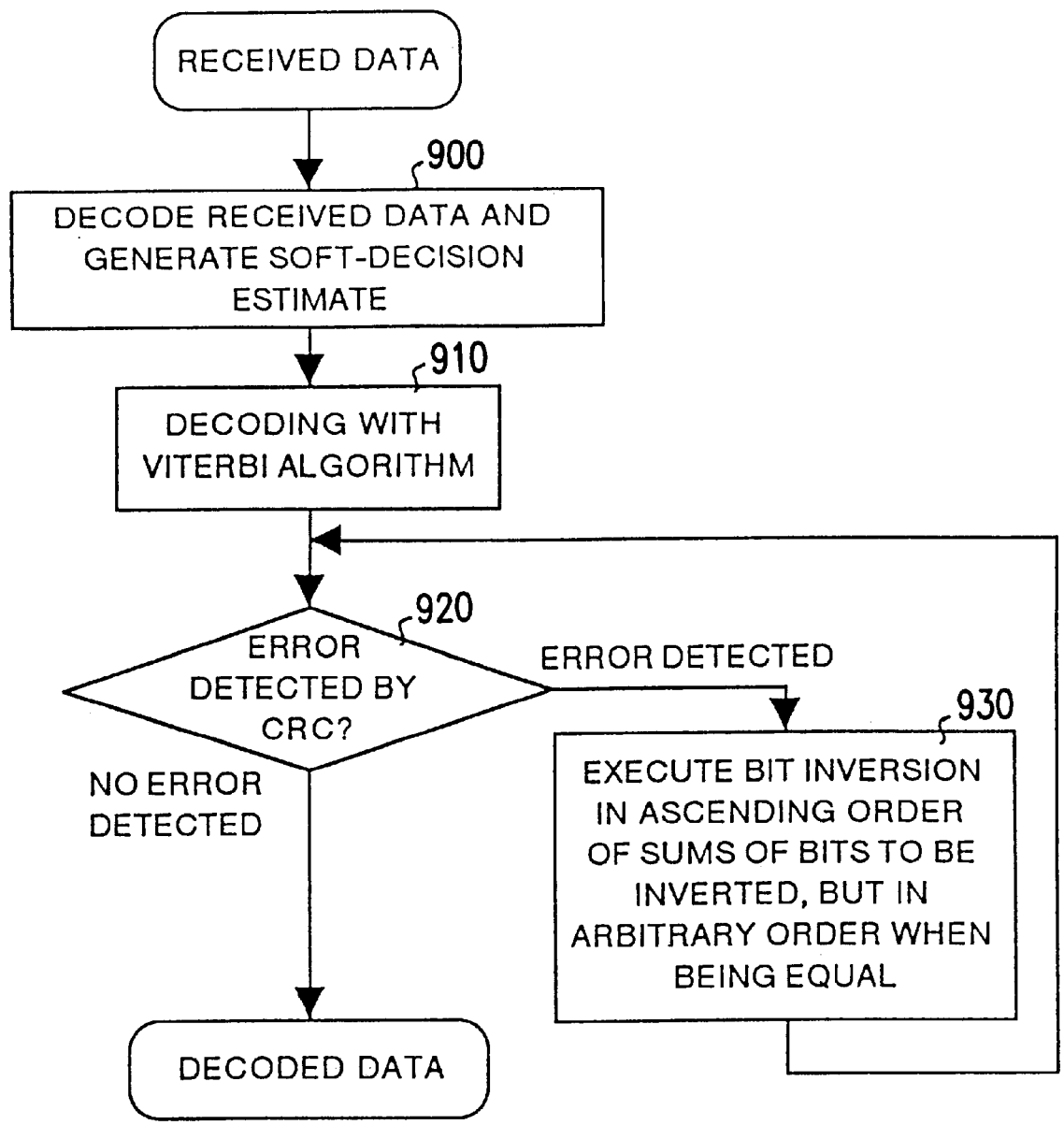
FIG. 21 is a flowchart showing the concatenated code error correcting/decoding method by the error correcting/decoding apparatus according to Embodiment 9.

FIG. 21 shows a flowchart showing a sequence of operations by a decoder in the concatenated code error correcting/decoding method in Embodiment 9 of the present invention.

It should be noted that since the processing is the same as those in steps 800 to 820 in Embodiment 8 shown in FIG. 18 until it is determined as "No error detected" in step 900 to step 920, such description of the processing is omitted herein.

Namely, when any error is detected ("Error detected" in step 920) as a result of the CRC, in Embodiment 9, the bit inverter 4D executes bit inversion on the bit sequence obtained by executing decoding operation according to the Viterbi algorithm in ascending order of a sum of bits to be inverted or in an arbitrary order, for instance, the order of priority put on the left side bit when a sum of bits to be inverted is equal (step 930), the bit sequence with the bits to be subjected to inversion is input again to the CRC means 3 to make it execute the processing in step 920, and the processing in this step 930 is repeated until no error is detected by the CRC means 3.

FIG. 22 shows an example of a bit inversion sequence in the bit inverter 4D in Embodiment 9 of the present invention.

In this figure, as is a case of Embodiment 1 shown in FIG. 3 or the like, two bit sequences of "00000" and "01101" are subjected to bit inversion, and reliability is "35241" in both cases.

Then, the bit inverter 4D executes bit inversion in ascending order of sums of bits to be inverted or in an arbitrary order, for instance, in the order of priority put on the left side bit when sums of bits to be inverted are equal, so that, in a case of a bit sequence of "00000", the bit inversion is executed in the order of "10000", "01000", "00100", and "00010".

Accordingly, with the error correcting/decoding apparatus in Embodiment 9, when bit inversion is to be executed, bit inversion is executed in ascending order of sums of bits to be inverted, but in an arbitrary order of sums of bits to be inverted are equal, so that, as is a case where bit inversion is executed in ascending order of sums of reliability for bits to be inverted, when errors only in some bits are detected in the bit sequence decoded by a Viterbi decoding operation, the errors can be corrected by means of bit inversion, thus error correcting capability being improved. In addition, as for the work load for computing, a work load for computing of Viterbi decoding operation sharing large portion of the encoding operation does not increase, and increase in the work load for computing is limited to that in the CRC operation and addition of the bit inverting operation, and for this reason increase in the work load for computing as a whole is negligible.

In Embodiment 9, as bit inversion is executed without using reliability, a work load for computing can be reduced by the above proportion, and high-speed error correction can be executed.

It should be noted that, in Embodiment 9, the error correcting/decoding apparatus according to Embodiment 1 has been described with configuration in which the bit inverter 4A is replaced with the bit inverter 4D, however, in the present invention, the bit inverter 4A in the error correcting/decoding apparatus according to any of Embodiments 2 to 6 may be replaced to the bit inverter 4D in Embodiment 9. In this case, although the operations are not described in detail, each processing in step 260 in FIG. 5, step 370 in FIG. 7, step 470 in FIG. 9, step 570 in FIG. 11, and in step 670 in FIG. 13 as bit inversion processing in Embodiments 2 to 6 respectively is replaced with the processing in step 930 in Embodiment 9 shown in FIG. 21. For this reason, especially in bit inversion by this bit inverter 4D, as bit inversion is executed in no consideration of reliability, when the bit inverter 4D in Embodiment 9 is applied to a device in which bit sequences as candidates for decoded data are stored, like in Embodiments 3 to 6, one with the smallest sum of reliability or that of soft-decision estimate is selected as decoded data, reliability or soft-decision estimate is referred to when one decoded data is selected from a some of candidates, thus error correcting capability being more improved than that in a case of Embodiment 9.

Next description is made for Embodiment 10 of the error correcting/decoding apparatus according to the present invention.

Figure 23:
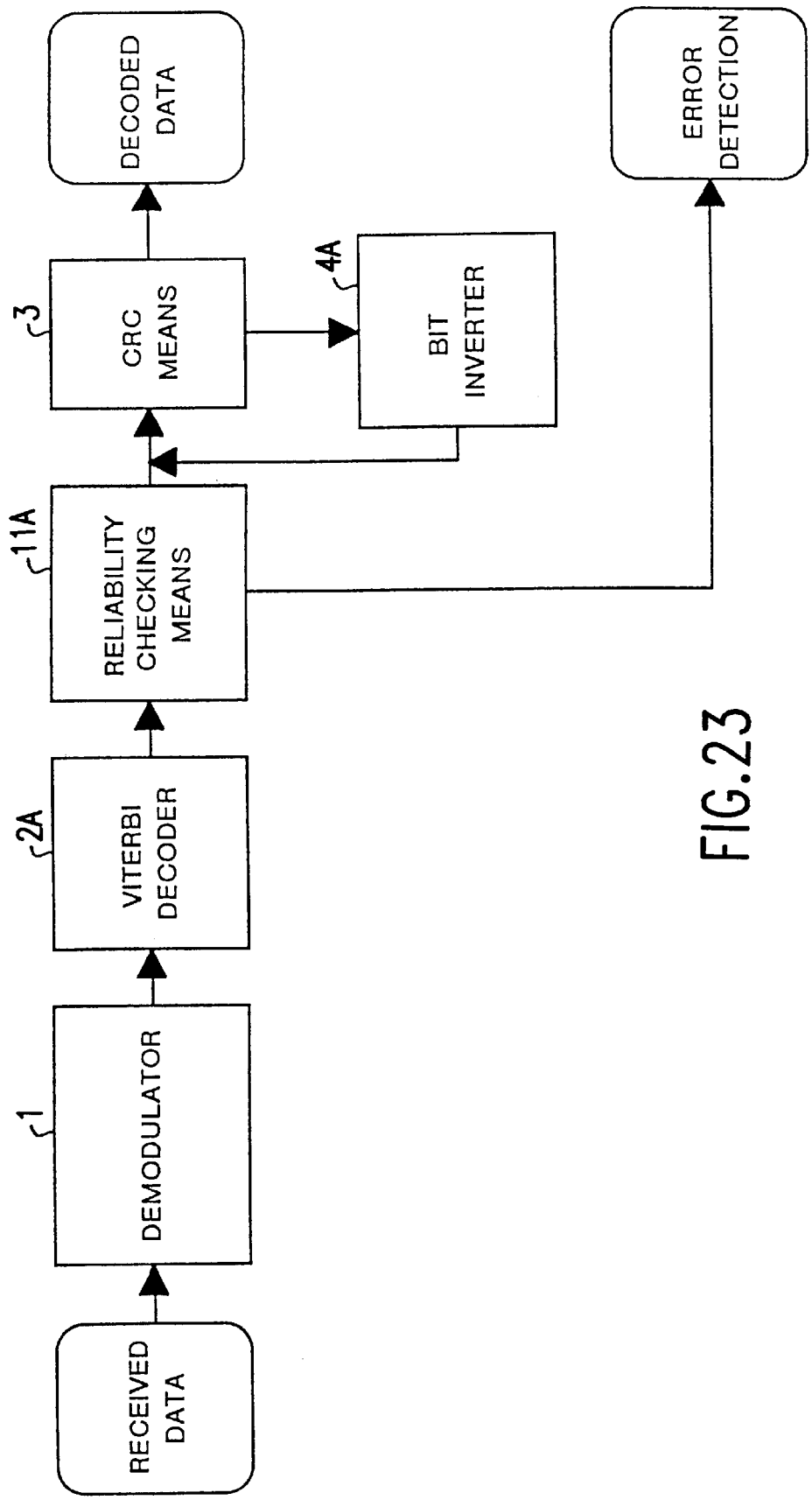
FIG. 23 is a block diagram showing the configuration of the error correcting/decoding apparatus according to Embodiment 10 of the present invention.

FIG. 23 is a block diagram showing configuration of the error correcting/decoding apparatus according to Embodiment 10 of the present invention. It should be noted that, in this embodiment, the same reference numerals are assigned to the same functions corresponding to those in each configuration according to the other embodiments described above.

In this figure, designated at the reference numeral 1 is a demodulator, at 2A a Viterbi decoder, at 3 a CRC means, at 4A a bit inverter, and at 11A a reliability checking means for obtaining a sum of reliability for a bit in a bit sequence, terminating the decoding operation as error detection when the sum of reliability is not more than a prespecified threshold value, and outputting the decoded bit sequence to the CRC means when the sum of reliability is larger than the prespecified threshold value.

Next description is made for operation.

Figure 24:
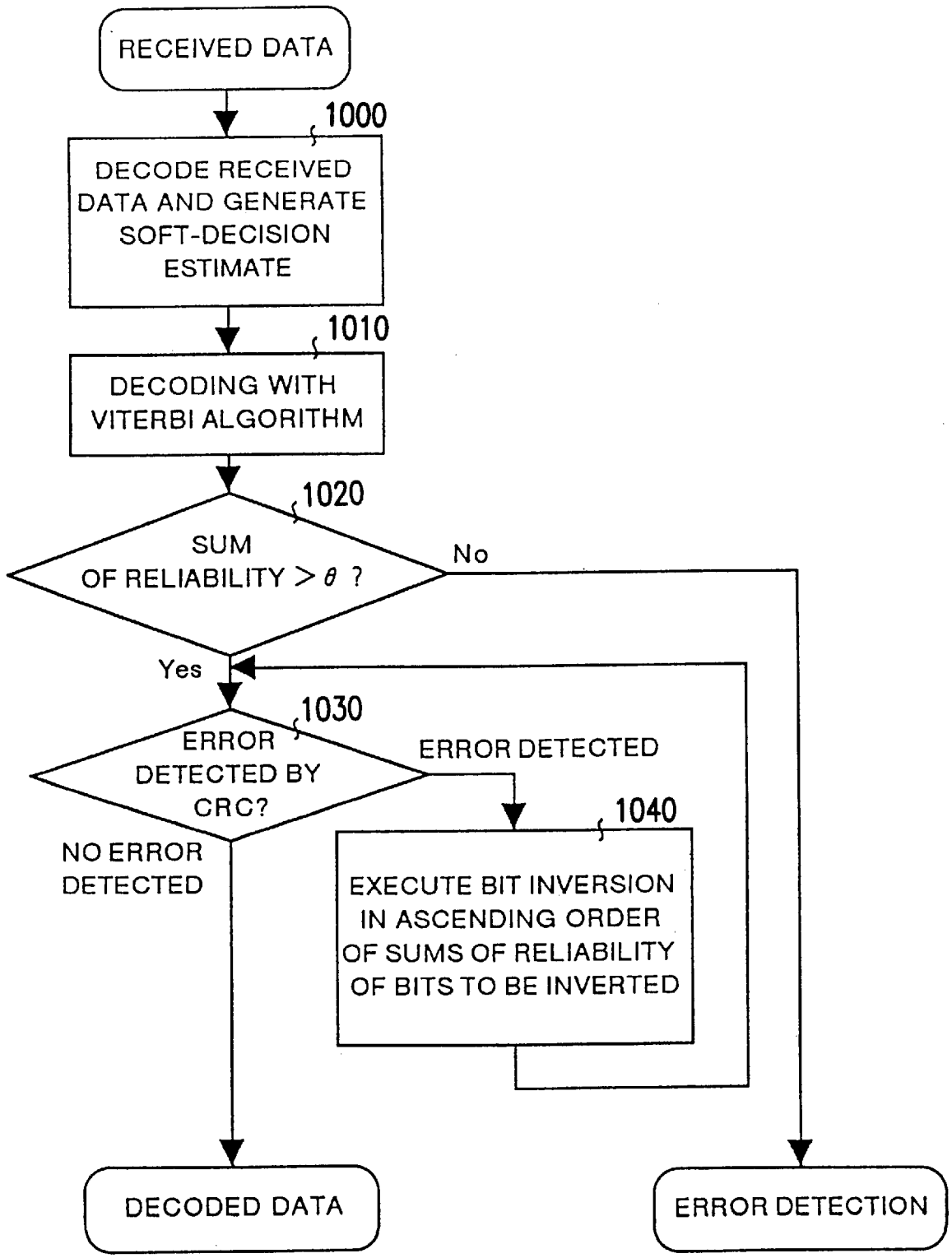
FIG. 24 is a flowchart showing the concatenated code error correcting/decoding method by the error correcting/decoding apparatus according to Embodiment 10.

FIG. 24 is a flowchart showing a sequence of operations by a decoder in the concatenated code error correcting/decoding method in Embodiment 10 of the present invention.

When received data is input into the demodulator 1, at first the demodulator 1 demodulates the received data, and also computes soft-decision estimate for a received signal from amplitude and a phase of the received signal (step 1000), then, the Viterbi decoder 2A selects a path with a large path metrics according to the soft-decision estimate generated in the demodulator 1, and decoded data after traceback is generated (step 1010) Then, a difference in branch metrics used in the selecting operation is appended to each bit in the decoded bit sequence as reliability.

Then, in Embodiment 10, the reliability checking means 11A obtains a sum of reliability for each bit in the bit sequence output from the Viterbi decoder 2A and determines whether the sum of reliability is larger than a prespecified threshold value θ or not (step 1020).

Then, when it is determined that the sum of reliability is not more than the prespecified threshold value θ ("NO" in step 1020), it is determined that the complex bit sequence can not be relied on, and the decoding operation is terminated as error detection. On the other hand, when it is determined that the sum of reliability is not less than the prespecified threshold value θ ("YES" in step 1020), at first, CRC is executed to the bit sequence input by the CRC means 3, determination is made as to whether any error is detected by the CRC or not (step 1030), and when it is detected that no error is detected thereby ("No error detected" in step 1030), the bit sequence is output as decoded data and the decoding operation is terminated.

In contrast, when any error is detected by the CRC ("Error detected" in step 1030), like in a case in Embodiment 1, the bit inverter 4A executes bit inversion to a bit sequence obtained by executing decoding operation according to the Viterbi algorithm in ascending order of a sum of reliability for bits to be inverted (step 1040), the bit sequence is input again to the CRC means 3 to make it execute the processing in step 1030, and the bit inverting processing in this step 1040 is repeated until no error is detected by the CRC means 3.

Accordingly, with the error correcting/decoding apparatus in Embodiment 10, before CRC is executed, a sum of reliability for a bit sequence decoded by the Viterbi algorithm is checked, and decoding processing for terminating the decoding operation is added as error detection when the sum is not more than a prespecified threshold value, whereby decoding operation is not executed as error detection when reliability of an entire bit sequence is low, which insures further improvement of the error correcting capability. In addition, as far as a work load for computing is concerned, a work load for computing for Viterbi decoding operation sharing a large portion of the encoding operation does not increase, and increase in the work load for computing is limited to that in the CRC operation and to addition of the bit inverting operation, and for this reason increase in the work load for computing as a whole is negligible.

It should be noted that, in Embodiment 10, description has been made for the configuration in which the reliability checking means 11A for checking reliability for a bit sequence is provided between the bit inverter 4A and the CRC means 3 in the error correcting/decoding apparatus according to Embodiment 1, however, in the present invention, the reliability checking means 11A may be provided in any of Embodiments 2 to 9, and if it is so constructed, decoding operation is not executed as error detection when reliability is low as an entire bit sequence, which makes it possible to further improve error correcting capability.

Next description is made for Embodiment 11 of the error correcting/decoding apparatus according to the present invention.

Figure 25:
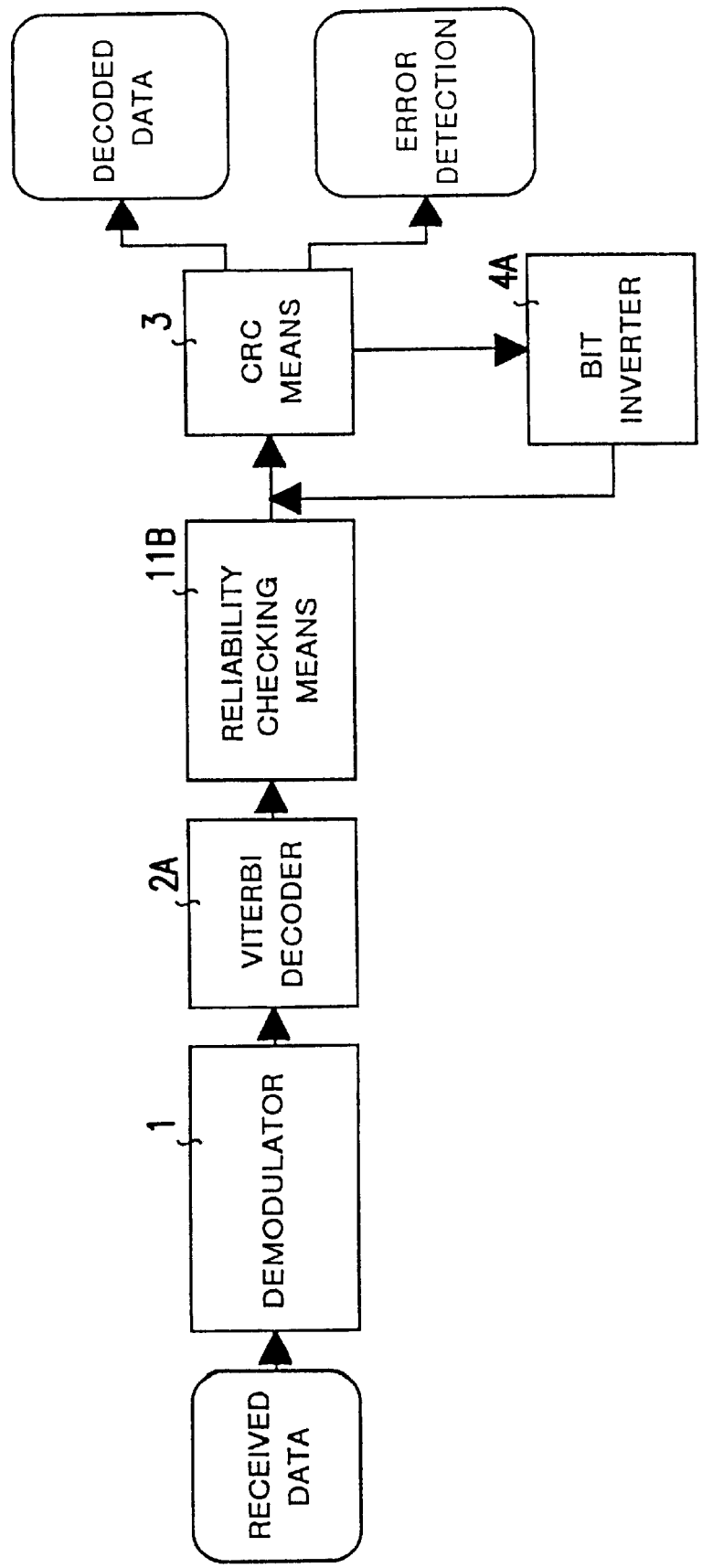
FIG. 25 is a block diagram showing the configuration of the error correcting/decoding apparatus according to Embodiment 11 of the present invention.

FIG. 25 is a block diagram showing configuration of the error correcting/decoding apparatus according to Embodiment 11 of the present invention. It should be noted that, in this Embodiment 11, the same reference numerals are assigned to the same functions corresponding to those in each configuration according to the other embodiments described above.

In this figure, designated at the reference numeral 1 is a demodulator, at 2A a Viterbi decoder, at 3 a CRC means, at 4A a bit inverter, and at 11B a reliability checking means for obtaining a sum of reliability for a bit in a bit sequence and making the CRC means 3 execute error detection according to CRC only once when the sum of reliability is not more than a prespecified threshold value.

Next description is made for operation.

Figure 26:
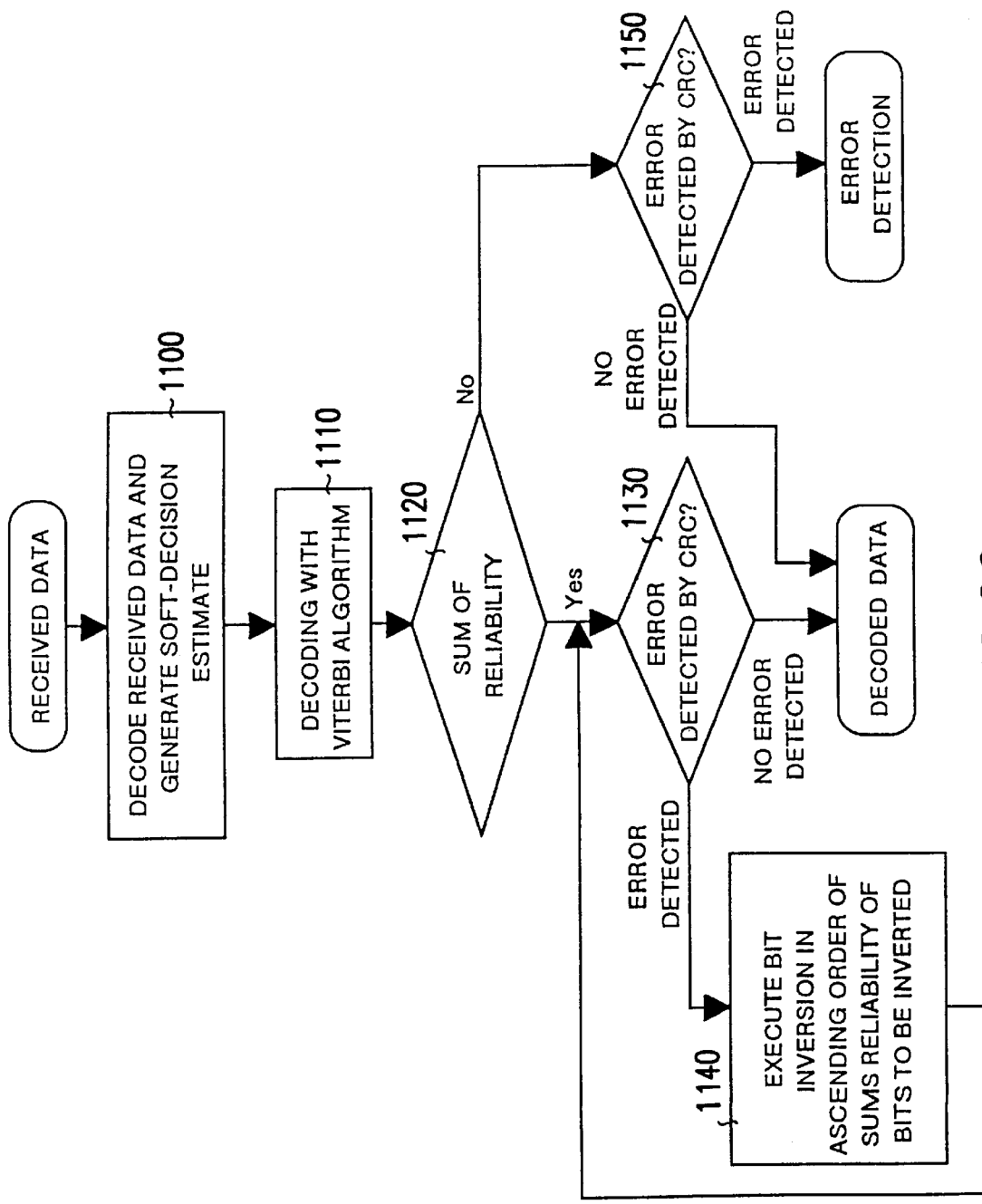
FIG. 26 is a flowchart showing the concatenated code error correcting/decoding method by the error correcting/decoding apparatus according to Embodiment 11.

FIG. 26 is a flowchart showing a sequence of operations by a decoder in the concatenated code error correcting/decoding method in Embodiment 11 of the present invention. It should be noted that each processing in steps 1100 to 1140 shown in FIG. 26 is the same as the processing in steps 1000 to 1040 in Embodiment 10 shown in FIG. 24, so that description is made for the processing thereafter.

Namely, in Embodiment 11, the reliability checking means 11A obtains a sum of reliability for each bit in the bit sequence output from the Viterbi decoder 2A, and when determination is made as to whether the sum of reliability is larger than a prespecified threshold value θ or not (step 1120), when it is determined that the sum of reliability is not more than a prespecified threshold value θ ("NO" in step 1120), decoding operation is not instantly terminated as error detection as is in Embodiment 10, but the CRC means 3 executes CRC only once and determination is made as to whether any error is detected or not (step 1150), the decoding operation is terminated as error detection when any error is detected ("Error detected" in step 1150), and the decoding operation is terminated and the bit sequence is output as received data when no error is detected ("No error detected" in step 1150).

Accordingly, with the error correcting/decoding apparatus in Embodiment 11, before CRC is executed, a sum of reliability for a bit sequence decoded by the Viterbi algorithm is checked, and CRC is executed only once even when the sum is not more than a prespecified threshold value θ, decoding operation is terminated as error detection when any error is detected, and decoding operation is terminated with the bit sequence output as decoded data when no error is detected, and for this reason, even when the reliability is low as an entire bit sequence, it is possible to output received data with a result of no error detected by the CRC considered to be valued, thus error correcting capability being improved. In addition, as far as a work load for computing is concerned, a work load for computing for Viterbi decoding operation sharing a large portion of the encoding operation does not increase, and increase in the work load for computing is limited to that in the CRC operation and to addition of the bit inverting operation, and for this reason increase in the work load for computing as a whole is negligible.

It should be noted that, in Embodiment 11, description has been made for the configuration in which the reliability checking means 11B for checking reliability for a bit sequence is provided between the bit inverter 4A and the CRC means 3 in the error correcting/decoding apparatus according to Embodiment 1, however, in the present invention, the reliability checking means 11B may be provided in any of Embodiments 2 to 9.

Next description is made for Embodiment 12 of the error correcting/decoding apparatus according to the present invention.

Figure 27:
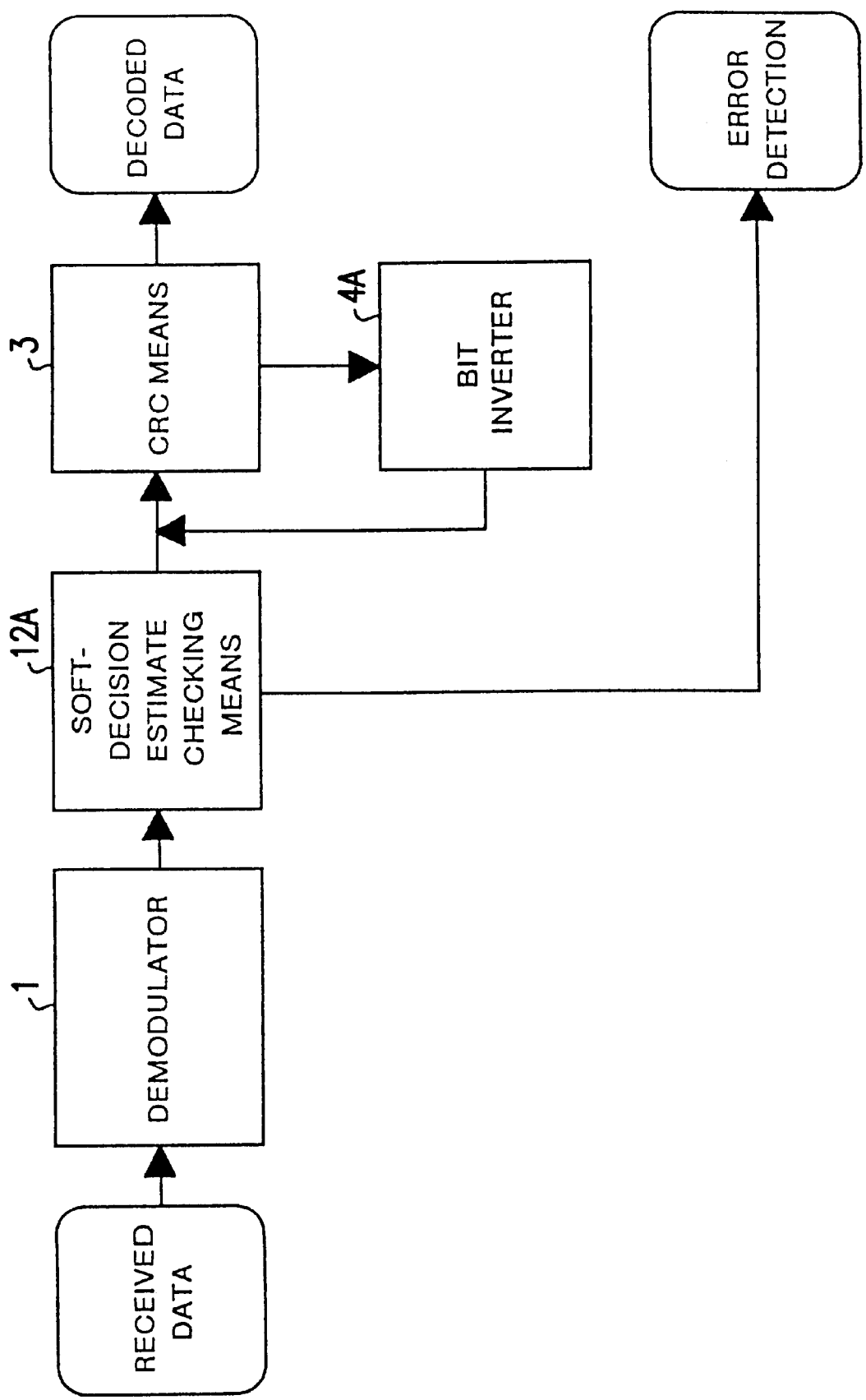
FIG. 27 is a block diagram showing the configuration of the error correcting/decoding apparatus according to Embodiment 12 of the present invention.

FIG. 27 is a block diagram showing configuration of the error correcting/decoding apparatus according to Embodiment 12 of the present invention. It should be noted that, in this Embodiment 12, the same reference numerals are assigned to the same functions corresponding to those in each configuration according to the other embodiments described above.

In this figure, designated at the reference numeral 1 is a demodulator, at 2A a Viterbi decoder, at 3 a CRC means, at 4A a bit inverter, and at 12A a soft-decision estimate checking means for obtaining a sum of soft-decision estimate for a bit in the received data, determining it as error detection when the sum of soft-decision estimate is not more than a prespecified threshold value, and outputting the received data to the Viterbi decoder 2A when the sum is larger than the value.

Next description is made for operation.

Figure 28:
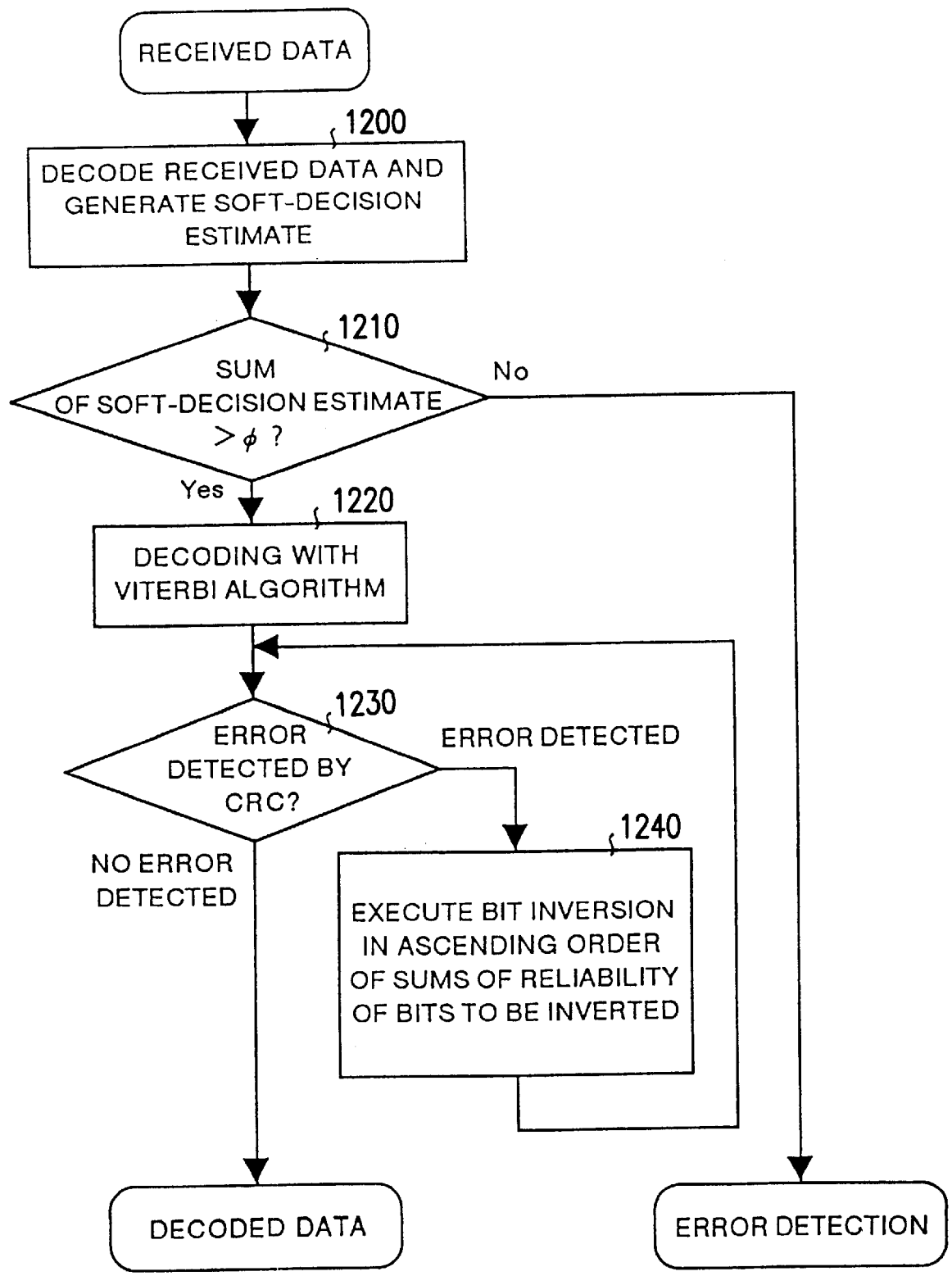
FIG. 28 is a flowchart showing the concatenated code error correcting/decoding method by the error correcting/decoding apparatus according to Embodiment 12.

FIG. 28 is a flowchart showing a sequence of operations by a decoder in the concatenated code error correcting/decoding method in Embodiment 12 of the present invention.

When received data is input into the demodulator 1, at first the demodulator 1 demodulates the received data, and also computes a soft-decision estimate for a received signal from amplitude and a phase of the received signal (step 1200).

Then, in Embodiment 12, the soft-decision estimate checking means 12A obtains a sum of soft-decision estimates generated in the demodulator 1, and determines whether the sum of soft-decision estimates is larger than a prespecified threshold value φ or not (step 1210), then, when it is determined that the sum of soft-decision estimates is not more than the prespecified threshold values φ ("NO" in step 1210), decoding operation is terminated as error detection.

On the other hand, when it is determined that the sum of soft-decision estimates is not less than the prespecified threshold value φ ("YES" in step 1210), the Viterbi decoder 2A selects a path with a large path metrics according to the soft-decision estimate generated in the demodulator 1, and decoded data after traceback is generated (step 1220). Then, a difference in branch metrics used in the selecting operation is appended to each bit in the decoded bit sequence as reliability.

Then, as in Embodiment 1, the CRC means 3 executes CRC to the decoded bit sequence, determines whether any error is detected or not (step 1230), outputs the bit sequence as decoded data and terminates the decoding operation when no error is detected ("No error detected" in step 1230), while when any error is detected ("Error detected" in step 1230), the bit inverter 4A executes bit inversion on the bit sequence obtained by decoding by the Viterbi algorithm in ascending order of sums of reliability for a bit to be inverted (step 1240), inputs the bit sequence again to the CRC means 3 to make it execute the processing in step 1230, and the bit inverting processing in this step 1230 is repeated until no error is detected by the CRC means 3.

Accordingly, with the error correcting/decoding apparatus in Embodiment 12, before the Viterbi decoder 2A. decodes the bit sequence by the Viterbi algorithm, a sum of soft-decision estimate for bits in an input by Viterbi decoder is obtained, determination is made as to whether the sum of soft-decision estimate is larger than a prespecified threshold valued φ or not, and decoding operation is terminated as error detection when it is determined that the sum is not more than the threshold value φ, so that it can be determined as error detection when soft-decision estimate is low as entire bits in the complex bit sequence, thus error correcting capability being more improved. In addition, as far as a work load for computing is concerned, a work load for computing for Viterbi decoding operation sharing a large portion of the encoding operation does not increase, and increase in the work load for computing is limited to that in the CRC operation and to addition of the bit inverting operation, and for this reason increase in the work load for computing as a whole is negligible.

It should be noted that, in Embodiment 12, description has been made for the configuration in which the soft-decision estimate checking means 12A for obtaining a sum of soft-decision estimate for bits in an input sequence and terminating decoding operation as error detection when the sum of soft-decision estimate is not more than the prespecified threshold value φ is provided between the demodulator 1 and the Viterbi decoder 2A in the error correcting/decoding apparatus according to Embodiment 1, however, in the present invention, the soft-decision estimate checking means 12A may be provided also in any of Embodiments 2 to 9.

Figure 29:
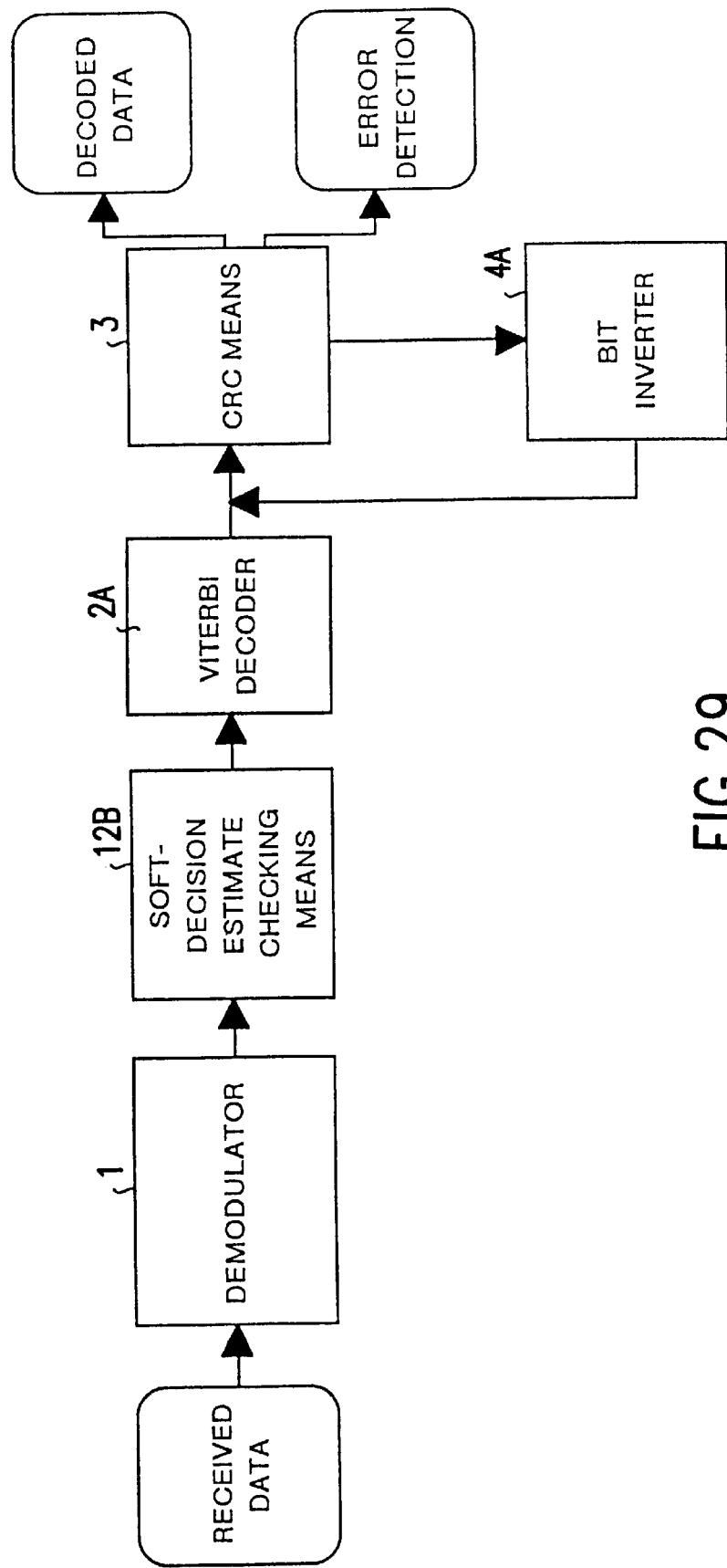
FIG. 29 is a block diagram showing the configuration of the error correcting/decoding apparatus according to Embodiment 13 of the present invention.

FIG. 29 is a block diagram showing configuration of the error correcting/decoding apparatus according to Embodiment 13 of the present invention. It should be noted that, in this Embodiment 13, the same reference numerals are assigned to the same functions corresponding to those in each configuration according to the other embodiments described above.

In this figure, designated at the reference numeral 1 is a demodulator, at 2A a Viterbi decoder, at 3 a CRC means, at 4A a bit inverter, and at 12B a soft-decision estimate checking means for obtaining a sum of soft-decision estimate for an input sequence and making the CRC means 3 execute error detection by CRC only once after the bit sequence is decoded by the Viterbi algorithm even when the sum of soft-decision estimate is not more than the prespecified threshold value.

Next description is made for operation.

Figure 30:
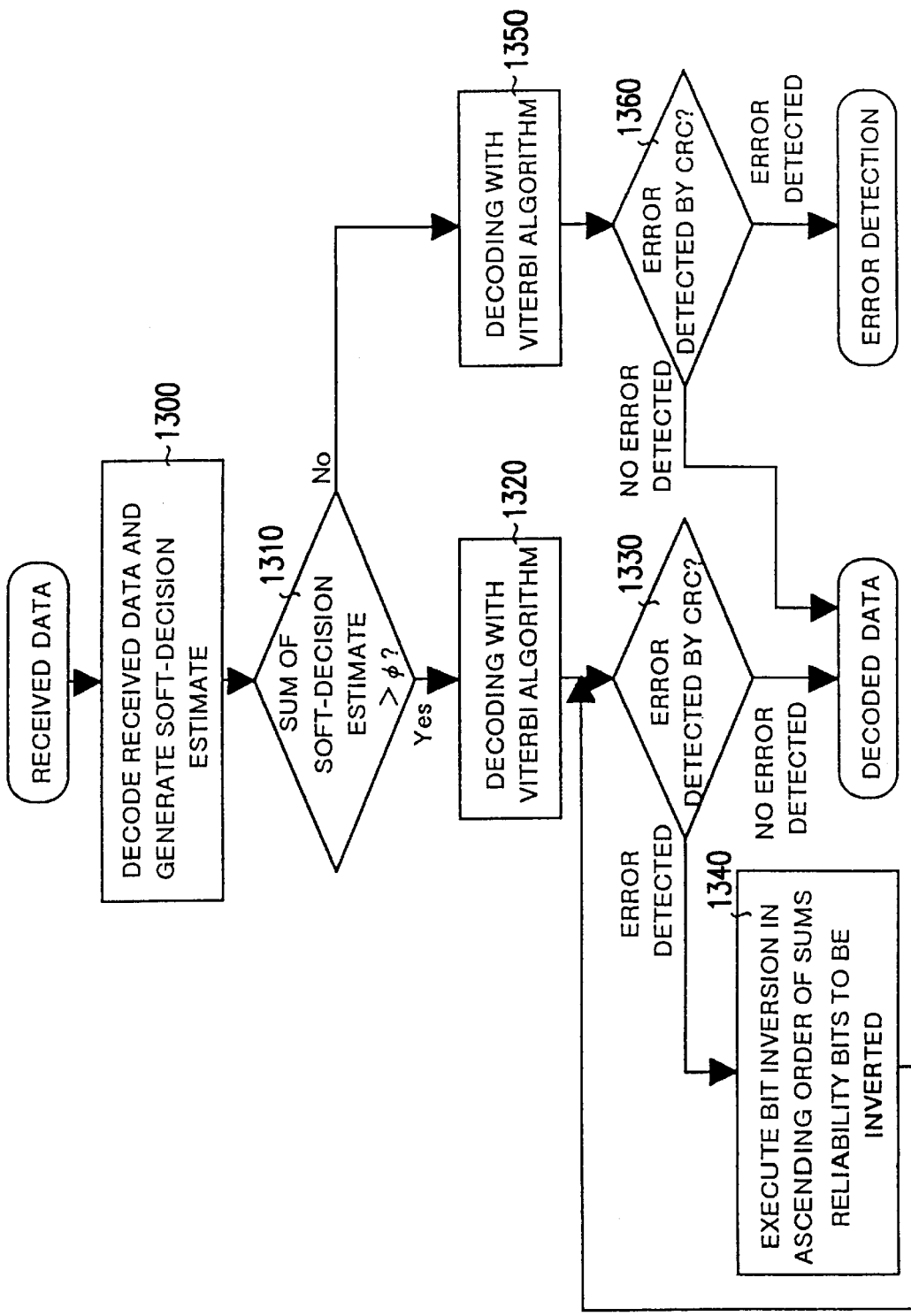
FIG. 30 is a flowchart showing the concatenated code error correcting/decoding method by the error correcting/decoding apparatus according to Embodiment 13.
Figure 31:
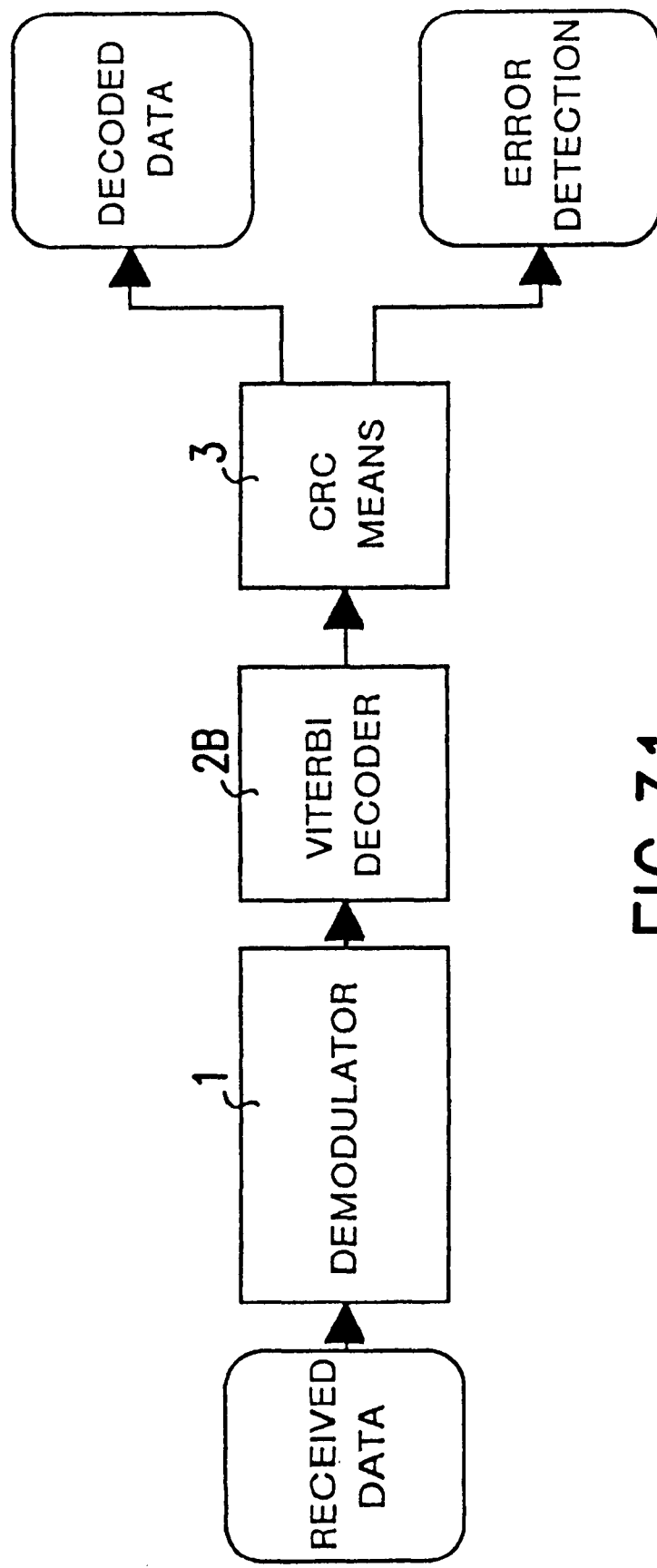
FIG. 31 is a block diagram showing the configuration of the concatenated code error correcting/decoding apparatus based on the conventional technology.
Figure 32:
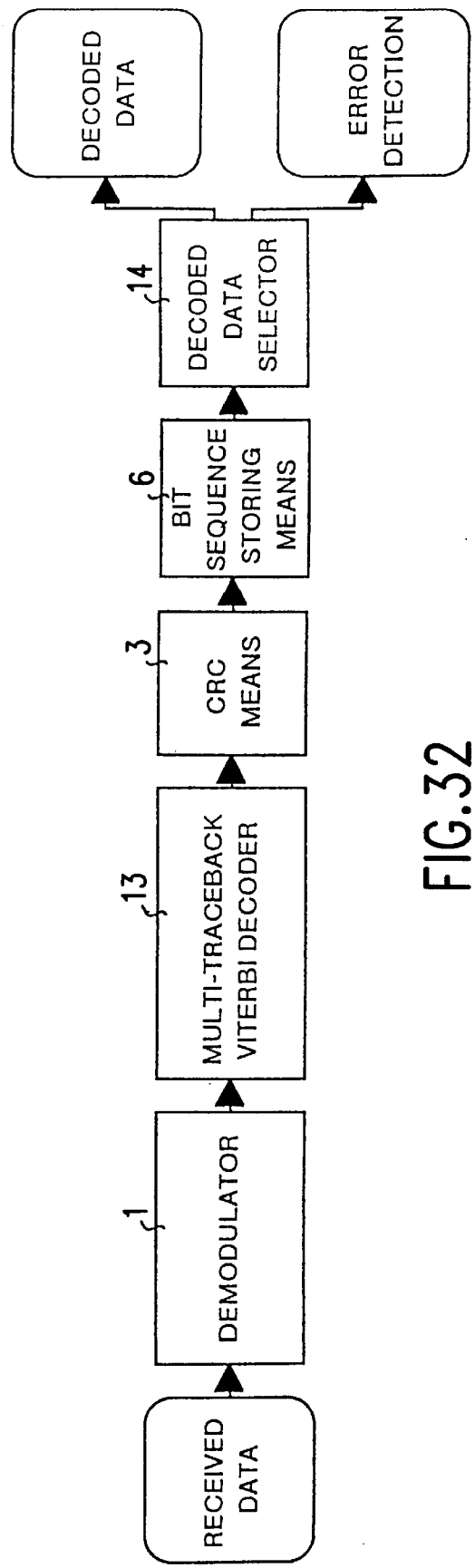
FIG. 32 is a block diagram showing the configuration of another concatenated code error correcting/decoding apparatus based on the conventional technology.

FIG. 30 is a flowchart showing a sequence of operations by a decoder in the concatenated code error correcting/ decoding method in Embodiment 13 of the present invention. It should be noted that each processing in steps 1300 to 1340 is the same as the processing in steps 1200 to 1240 in Embodiment 12 shown in FIG. 28, so that description is made for the processing thereafter.

Namely, in Embodiment 13, the soft-decision estimate checking means 12B obtains a sum of soft-decision estimates generated in the demodulator 1, and when determination has been made as to whether the sum of soft-decision estimates is larger than a prespecified threshold value φ or not (step 1310), when it is determined that the sum of soft-decision estimates is not more than the prespecified threshold value φ ("NO" in step 1310), as is a case where it is determined that the sum of soft-decision estimates is larger than the prespecified threshold value φ ("YES" in step 1310), the Viterbi decoder 2A selects a path with a large path metrics according to the soft-decision estimate generated in the demodulator 1, and decoded data after traceback is generated (step 1350). Then, a difference in branch metrics used in the selecting operation is appended to each bit in the decoded bit sequence as reliability.

Then, the CRC means 3 executes CRC on the bit sequence only once and determines whether any error is detected or not (step 1360), and terminates decoding operation as error detection when any error is detected ("Error detected" in step 1360), outputs the bit sequence as decoded data and terminates the decoding operation when no error is detected ("No error detected" in step 1360).

Accordingly, with the error correcting/decoding apparatus in Embodiment 13, before the Viterbi decoder decodes the bit sequence by the Viterbi algorithm, a sum of soft-decision estimates output from the demodulator is checked, and CRC is executed only once after the bit sequence is decoded by the Viterbi algorithm even when the sum is not more than the prespecified threshold value φ, and decoding operation is terminated as error detection when any error is detected, while the bit sequence is output as decoded data and decoding operation is terminated when no error is detected, and for this reason, even when the soft-decision estimate is low as an entire bit sequence, it is possible to output received data with a result of no error detected by the CRC considered to be valued, error correcting capability thereby being improved. In addition, as far as a work load for computing is concerned, a work load for computing for Viterbi decoding operation sharing a large portion of the encoding operation does not increase, and increase in the work load for computing is limited to that in the CRC operation and to addition of the bit inverting operation, and for this reason increase in the work load for computing as a whole is negligible.

It should be noted that, in Embodiment 13, description has been made for the configuration in which the soft-decision estimate checking means 12B is provided between the demodulator 1 and the Viterbi decoder 2A in the error correcting/decoding apparatus according to Embodiment 1, however, in the present invention, the soft-decision estimate checking means 12B may be provided also in any of Embodiments 2 to 9.

As described above, with the present invention, there are provided the steps of determining whether CRC times has reached a prespecified value by counting times of CRC; executing bit inversion for a bit sequence when the CRC times has not reached the prespecified value; and terminating the decoding operation as error detection when the CRC times has reached the prespecified value, so that, when any error is detected even if bit inversion and CRC are executed to a bit sequence up to a prespecified times, bit inversion and CRC are not continued further, and the decoding operation is terminated as error detection, and for this reason, times of CRC and bit inversion to be repeated again and a period of time required for it when an error is detected by means of CRC can be reduced.

With the present invention, there are provided the steps of: demodulating received data and generating soft-decision estimate according to the received data; decoding the received data demodulated as described above to a bit sequence according to the generated soft-decision estimate with the Viterbi algorithm and appending reliability to each bit in the bit sequence; checking whether any error is included or not by executing CRC to the decoded bit sequence; storing the bit sequence only when no error is detected; determining whether the CRC times has reached a prespecified value or not by counting times of CRC; executing bit inversion to said bit sequence when it is determined that the CRC times has not reached the prespecified value; checking whether any error is included or not by again executing CRC to the bit sequence having been subjected to bit inversion; counting the number of stored bit sequences when the CRC times has reached the prespecified value; terminating the decoding operation when no error is detected; and selecting a bit sequence with the smallest sum of reliability for inverted bit in the bit sequences or the smallest sum of soft-decision estimate for bit being subjected to bit inversion after having been re-encoded and outputting the bit sequence as decoded data when a some of errors are included, so that, when a few bits are erroneous in a bit sequence decoded by Viterbi decoder, the bits can be corrected by Viterbi decoding; whereby the error correcting capability is improved, a work load for computing as a whole can be reduced, and also a decoding error ratio can be reduced by selecting one with the highest reliability as decoded data from a some of candidates for decoded data not including any error therein. Especially, when re-encoding is to be executed, although a large work load and a long period of time are required for re-encoding, the probability of selecting a correct bit sequence can be made higher as compared to that in which re-encoding is not executed.

With the present invention, there are provided the steps of: demodulating received data and generating soft-decision estimate according to the received data; decoding said demodulated received data with the Viterbi algorithm to a bit sequence according to the generated soft-decision estimate and appending reliability to each bit in the bit sequence; checking whether any error is included by executing CRC to the decoded bit sequence; storing the bit sequence only when no error is detected; determining whether the number of the stored bit sequences has reached a prespecified value or not by counting it; executing bit inversion for said bit sequence when it is determined that the number of the stored bit sequences has not reached the prespecified value; executing again CRC to the bit sequence having been subjected to bit inversion; selecting a bit sequence with the smallest sum of reliability of inverted bit in the stored bit sequences or re-encoding the bit sequence and or selecting a bit sequence with the smallest sum of soft-decision estimate for bit being subjected to bit inversion after having been re-encoded when it is determined that the number of the stored bit sequence has reached a prespecified value, so that, also in this case, when a few bits are erroneous in a bit sequence decoded by Viterbi decoder, the bits can be corrected by Viterbi decoding; whereby the error correcting capability is improved, a work load for computing as a whole can be reduced, and also a decoding error ratio can be reduced by selecting one with the highest reliability from a set of candidates for decoded data not including any error therein. Especially, when re-encoding is to be executed, although a large work load and a long period of time are required for re-encoding, the probability of selecting a correct bit sequence can be made higher as compared to that in which re-encoding is not executed.

Also, in these inventions, when bit inversion is to be executed, CRC can be executed for bits with higher reliability by executing bit inversion in ascending order of sums of reliability for bits to be inverted, or executing bit inversion in ascending order of binary numbers from 0 (zero) regarding a bit with the smallest reliability as the lowest bit and also a bit with the largest reliability as the highest bit, or executing in ascending order of sums of bits to be inverted, so that error correction can be executed rapidly with a small work load for computing.

Also in these inventions, when a sum of reliability for a bit sequence decoded according to the Viterbi algorithm or a sum of soft-decision estimate generated when received data is demodulated is checked, if the sum is not more than a prespecified threshold value, the decoding operation can be terminated as error detection, or the CRC means executes CRC to the bit sequence only once to check whether any error is included or not, and the bit sequence is output as decoded data when no error is detected, or the decoding operation can be terminated as error detection when any error is included, so that the error correcting capability can be improved further.

This application is based on Japanese patent application No. HEI 9-105757 filed in the Japanese Patent Office on Apr. 23, 1997, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An error correcting/decoding apparatus comprising:
 a demodulator for demodulating received data and also generating a soft-decision estimate according to the received data;
 a Viterbi decoder for decoding the demodulated received data to a bit sequence with the Viterbi algorithm according to the soft-decision estimate generated by said demodulator;
 a CRC means for checking the existence of any error by executing CRC on a bit sequence decoded by said Viterbi decoder and outputting the bit sequence, when no error is detected, as decoded data; and
 a bit inverter for executing bit inversion for said bit sequence, when any error is detected by said CRC means, and outputting the bit sequence having been subjected to bit inversion to said CRC means for the inverted bit sequence to be subjected to CRC.

2. An error correcting/decoding apparatus according to claim 1, further comprising a CRC counter for counting a number of CRC executions by said CRC means and determining whether the number of CRC executions has reached a prespecified value, and also for making said bit inverter execute bit inversion for the bit sequence when the CRC executions have not reached the prespecified value and terminating the operation for decoding as detection of an error when the CRC executions have reached the prespecified value.

3. An error correcting/decoding apparatus according to claim 2; wherein said Viterbi decoder appends, when said demodulated received data is decoded to a bit sequence with the Viterbi algorithm according to soft-decision estimate generated by said decoder, reliability for each bit in the bit sequence.

4. An error correcting/decoding apparatus according to claim 1; wherein said Viterbi decoder appends, when said demodulated received data is decoded to a bit sequence with the Viterbi algorithm according to soft-decision estimate generated by said decoder, reliability for each bit in the bit sequence.

5. An error correcting/decoding apparatus according to claim 1; wherein said bit inverter executes bit inversion for said bit sequences in ascending order of a sum of reliability for bits to be subjected to bit inversion.

6. An error correcting/decoding apparatus according to claim 1; wherein said bit inverter executes bit inversion in ascending order of binary numbers from 0 when a bit with the smallest bit reliability is regarded as the lowest bit and also a bit with the largest bit reliability is regarded as the highest bit.

7. An error correcting/decoding apparatus according to claim 1; wherein said bit inverter executes bit inversion in ascending order of a sum of bits to be inverted or in ascending order of a sum of reliability of bits to be inverted when a sum of bits to be inverted is equal.

8. An error correcting/decoding apparatus according to claim 1; wherein said bit inverter executes bit inversion in ascending order of a sum of bits to be inverted or in an arbitrary order when a sum of bits to be inverted is equal.

9. An error correcting/decoding apparatus according to claim 1, further comprising a reliability checking section for checking a sum of reliability in a bit sequence decoded by the Viterbi decoder, terminating the decoding operation as error detection when the sum is not more than a prespecified threshold value, and also making the CRC means execute error detection by CRC when the sum of reliability is larger than said prespecified threshold value.

10. An error correcting/decoding apparatus according to claim 9; wherein said reliability checking section does not terminate the decoding operation as error detection when a sum of reliability in a bit sequence decoded by the Viterbi decoder is checked and the sum is not more than the prespecified threshold value, but makes the CRC means execute CRC only once to the decoded bit sequence for checking whether any error is included or not and output the bit sequence as decoded data when no error is detected, or terminate the decoding operation as error detection when any error is detected.

11. An error correcting/decoding apparatus according to claim 1, further comprising a soft-decision estimate checking section for checking a sum of soft-decision estimate generated by said decoder, terminating the decoding operation as error detection when the sum is not more than a prespecified threshold value, and making the Viterbi decoder decode received data to a bit sequence according to said soft-decision estimate when the sum of said soft-decision estimate is larger than the threshold value.

12. An error correcting/decoding apparatus according to claim 11; wherein said soft-decision estimate checking section does not terminate the decoding operation as error detection when a sum of soft-decision estimate generated by said decoder is checked and the sum is not more than a prespecified threshold value, but makes the Viterbi decoder decode received data to a bit sequence according to said soft-decision estimate, and makes said CRC means execute CRC to the decoded bit sequence only once for checking whether any error is included or not, makes the CRC means output the bit sequence as decoded data when no error is detected and terminates the decoding operation as error detection when any error is detected.

13. An error correcting/decoding apparatus comprising:
  a demodulator for demodulating received data and generating a soft-decision estimate according to the received data;
  a Viterbi decoder for decoding said demodulated received data to a bit sequence with the Viterbi algorithm according to the soft-decision estimate generated by said demodulator and also appending reliability to each bit in said bit sequence;
  a CRC means for checking the existence of any error by executing CRC on the bit sequence decoded by said Viterbi decoder;
  a bit sequence memory for storing the bit sequence only when no error is detected by said CRC means;
  a CRC counter for counting a number of CRC executions by said CRC means and checking whether the number of CRC executions has reached a prespecified value or not;
  a bit inverter for executing bit inversion for said bit sequence when it is determined by said CRC counter that the number of CRC executions has not reached the prespecified value and outputting the bit sequence after bit inversion to said CRC means for the bit sequence to be subjected to CRC again; and
  a reliability computing/selecting section for counting the number of bit sequences stored in said bit sequence memory when it is determined by said CRC counter that said CRC executions have reached the prespecified value and terminating the decoding operation as error detection if no error is detected and also for selecting and outputting as decoded data a bit sequence with the smallest sum of reliability for the inverted bits in the bit sequence when errors are detected.

14. An error correcting/decoding apparatus comprising:
  a demodulator for demodulating received data and generating soft-decision estimate according to the received data;
  a Viterbi decoder for decoding the demodulated received date to a bit sequence with the Viterbi algorithm according to the soft-decision estimate generated by said demodulator and also appending reliability to each bit in the bit sequence; a CRC means for checking the existence of any error by executing CRC on the bit sequence decoded by said Viterbi decoder; a bit sequence memory for storing the bit sequence only when no error is detected by said CRC means;
  a CRC counter for counting the number of CRC executions by said CRC means and checking whether the number of CRC executions has reached a specified value or not;

a bit inverter for executing bit inversion for said bit sequence when it is determined by said CRC counter that the CRC executions have not reached the prespecified value and outputting the bit sequence having been subjected to bit inversion to the CRC means for the bit sequence to be subjected to CRC again;

a re-encoder for counting the number of bit sequences stored in said bit sequence memory when it is determined by said CRC counter that the CRC times has reached a prespecified value, terminating the decoding operation as error detection when no error is detected, and re-encoding each bit sequence when a some of errors are detected; and a soft-decision estimate computing/selecting section for selecting and outputting as decoded data a bit sequence with the smallest sum of soft-decision estimate for each inverted bit by comparing the bit sequence re-encoded by said re-encoder to the received data.

15. An error correcting/decoding apparatus comprising:

a demodulator for demodulating received data and generating soft-decision estimate according to the received data;

a Viterbi decoding said demodulated received data to a bit sequence with the Viterbi algorithm according to the soft-decision estimate generated by said demodulator and also appending reliability to each bit in the bit sequence;

a CRC means or checking the existence of any error by executing CRC on the bit sequence decoded by said Viterbi decoder;

a bit sequence memory for storing the bit sequence only when no error is detected by said CRC means;

a bit sequence counter for counting the number of bit sequences stored in said bit sequence memory and checking whether the number of the bit sequences has reached a prespecified value or not;

a bit inverter for inverting bits in said bit sequence when it is determined by said bit sequence counter that the number of bit sequences has not reached a prespecified value and outputting a bit sequence having been subjected to bit inversion to said CRC means for the bit sequence to be subjected to CRC again; and a reliability computing/selecting unit for selecting and outputting as decoded data a bit sequence with the smallest sum of reliability for each inverted bit among the bit sequences stored in said bit sequence memory when it is determined by said bit sequence counter that the number of bit sequences has reached a prespecified value.

16. An error correcting/decoding apparatus comprising:

a demodulator for demodulating received data and also generating soft-decision estimate according to the received data;

a Viterbi decoder for decoding demodulated said received data to a bit sequence with the Viterbi algorithm according to the soft-decision estimate generated by said demodulator and also appending reliability to each bit in the bit sequence;

a CRC means for checking the existence of any error is included or not by executing CRC on the bit sequence decoded by said Viterbi decoder;

a bit sequence memory for storing the bit sequence only when no error is detected by said CRC means;

a CRC counter for counting the number of CRC executions by said CRC means and determining whether the number of CRC executions has reached a prespecified value;

a bit inverter for inverting bits in said bit sequence when it is determined by said CRC counter that the CRC executions have not reached the prespecified value and outputting the bit sequence having been subjected to bit inversion to the CRC means for the bit sequence to be subjected to CRC again;

a re-encoder for re-encoding a bit sequence stored in said bit sequence memory when it is determined by said CRC counter that the CRC executions have reached the prespecified value; and a soft-decision estimate computing/selecting unit for selecting and outputting as decoded data a bit sequence with the smallest sum of soft-decision estimate for each inverted bit by comparing the bit sequence re-encoded by said re-encoder to received data.

17. An error correcting/decoding method comprising the steps of:

demodulating received data and generating soft-decision estimate based on the received data;

decoding said received data demodulated as described above to a bit sequence with the Viterbi algorithm according to said generated soft-decision estimate;

checking the existence of any error by executing CRC on the decoded bit sequence;

executing bit inversion for the bit sequence when any error is detected and checking whether any error exists or not by again executing CRC to the bit sequence having been subjected to bit inversion; and outputting the bit sequence as decoded data when no error is detected.

18. An error correcting/decoding method according to claim 17 further comprising the steps of:

determining whether CRC times has reached a prespecified value by counting the number of CRC executions;

executing bit inversion for a bit sequence when the CRC executions have not reached the prespecified value; and terminating the decoding operation as error detection when the CRC executions have reached the prespecified value.

19. An error correcting/decoding method according to claim 17; wherein reliability is appended to each bit in a bit sequence when said demodulated received data is decoded to the bit sequence with the Viterbi algorithm according to soft-decision estimate.

20. An error correcting/decoding method according to claim 17; wherein bit inversion for the bit sequence is executed in ascending order of the sums of reliability for bits to be inverted when an error is detected by executing CRC.

21. An error correcting/decoding method according to claim 17; wherein, when any error is detected by executing CRC, bit inversion is executed in ascending order from the binary number of 0 regarding the bit with the smallest reliability for bit as the lowest bit and the bit with the largest bit as the highest bit.

22. An error correcting/decoding method according to claim 17; wherein bit inversion is executed in ascending order of sums of bits to be inverted when any error is included by executing CRC, and in ascending order of sums of reliability for bits to be inverted when the sums of bits to be inverted are equal.

23. An error correcting/decoding method according to claim 17, wherein bit inversion is executed in ascending order of sums of bits to be inverted when an error is detected by executing CRC and in an arbitrary order when the sums of bits to be inverted are equal.

24. An error correcting/decoding method according to claim 17; wherein a sum of reliability for a bit sequence decoded according to the Viterbi algorithm is checked, the decoding operation is terminated as error detection when the sum is not more than a prespecified threshold value, and error detection is executed by way of CRC when the sum of reliability is larger than the threshold value.

25. An error correcting/decoding method according to claim 24; wherein, when a sum of reliability in a bit sequence decoded according to the Viterbi algorithm is checked, if the sum is not more than a prespecified threshold value, the decoding operation is not terminated as error detection, but checking is executed as to whether any error is included or not by executing CRC on the decoded bit sequence only once, and the bit sequence is output as decoded data when no error is detected, and the decoding operation is terminated as error detection if any error is detected.

26. An error correcting/decoding method according to claim 17; wherein, when a sum of soft-decision estimate generated in demodulation of received data is checked, the decoding operation is terminated as error detection when the sum is not more than a prespecified threshold value, and the received data is decoded to a bit sequence with the Viterbi algorithm according to the soft-decision estimate when the sum of soft-decision estimate is larger than the prespecified threshold value.

27. An error correcting/decoding method according to claim 26; wherein, when a sum of soft-decision estimate generated in demodulation of received data is checked, if the sum is not more than a prespecified threshold value, the decoding operation is not terminated as error detection, but the received data is decoded to a bit sequence with the Viterbi algorithm according to the soft-decision estimate, checking is executed as to whether any error is included or not by executing only once CRC to the decoded bit sequence, the bit sequence is output as decoded data when no error is detected, and the decoding operation is terminated as error detection when any error is detected.

28. An error correcting/decoding method comprising the steps of:
  demodulating received data and generating soft-decision estimate according to the received data;
  decoding the received data demodulated as described above to a bit sequence according to the generated soft-decision estimate with the Viterbi algorithm and appending reliability to each bit in the bit sequence;
  checking the existence of any error by executing CRC on the decoded bit sequence;
  storing the bit sequence only when no error is detected;
  determining whether the CRC executions have reached a prespecified value or not by counting the number of CRC executions;
  executing bit inversion on said bit sequence when it is determined that the CRC executions have not reached the prespecified value;
  checking the existence of any error by again executing CRC on the bit sequence having been subjected to bit inversion;
  counting the number of stored bit sequences when the CRC executions have reached the prespecified value;
  terminating the decoding operation when no error is detected; and
  selecting a bit sequence with the smallest sum of reliability for inverted bit in the bit sequence and outputting the bit sequence as decoded data when errors exist.

29. An error correcting/decoding method comprising the steps of:
  demodulating received data and generating soft-decision estimate according to the received data;
  decoding said demodulated received data with the Viterbi algorithm to a bit sequence according to the generated soft-decision estimate and appending reliability to each bit in the bit sequence;
  checking the existence of any error by executing CRC on the decoded bit sequence; storing the bit sequence only when no error is detected;
  determining whether CRC executions have reached a prespecified value or not by counting CRC executions;
  executing bit inversion for said bit sequence when it is determined that the CRC executions have not reached the prespecified value;
  checking whether any error is present or not by again executing CRC on the bit sequence having been subjected to bit inversion;
  counting the number of said stored bit sequences when the CRC executions have reached the prespecified times;
  terminating the decoding operation as error detection when no error is detected;
  re-encoding each bit sequence when errors are detected; and
  selecting a bit sequence with the smallest sum of soft-decision estimate of bit already having been subjected to bit inversion and outputting the bit sequence as decoded data by comparing the re-encoded bit sequence to the received data.

30. An error correcting/decoding method comprising the steps of:
  demodulating received data and generating soft-decision estimate according to said received data;
  decoding said demodulated received data with the Viterbi algorithm to a bit sequence according to the generated soft-decision estimate and appending reliability to each bit in the bit sequence;
  checking the existence of any error by executing CRC on the decoded bit sequence;
  storing the bit sequence only when no error is detected;
  determining whether the number of bit sequence has reached a prespecified value or not by counting a number of bit sequences stored as described above;
  executing bit inversion for the bit sequence when it is determined that the number of bit sequences has not reached the prespecified value;
  again executing the bit sequence having been subjected to bit inversion; and
  selecting a bit sequence with the smallest sum of reliability for bits having been bit inversion among the stored bit sequence and outputting the bit sequence as decoded data when it is determined that the number of bit sequences has reached the prespecified value.

31. An error correcting/decoding method comprising the steps of:
  demodulating received data and generating soft-decision estimate according to the received data;
  decoding said demodulated received data with the Viterbi algorithm to a bit sequence according to the generated soft-decision estimate and appending reliability to each bit in the bit sequence;
  checking the existence of any error by executing CRC on the decoded bit sequence;

storing the bit sequence only when no error is detected;

determining whether CRC executions have reached a prespecified value by counting the number of CRC executions;

executing bit inversion for the bit sequence when it is determined that the CRC executions have not reached the prespecified value;

checking whether any error is present or not by again executing CRC to the bit sequence having been subjected to bit inversion;

re-encoding the stored bit sequence when it is determined that the CRC executions have reached the prespecified value; and selecting a bit sequence with the smallest sum of soft-decision estimate for bits having been subjected to bit inversion and outputting the bit sequence as decoded data by comparing the re-encoded bit sequence to the received data.

* * * * *

UNITED STATES PATENT AND TRADEMARK OFFICE
CERTIFICATE OF CORRECTION

PATENT NO. : 6,061,823
DATED : May 9, 2000
INVENTOR(S) : Hideaki Nara

It is certified that error appears in the above-identified patent and that said Letters Patent is hereby corrected as shown below:

Column 1,
Line 35, after "terminated" insert -- as --.

Column 8,
Line 24, after "CRC" insert -- operations --.

Column 9,
Line 27, replace "on" with -- no --.

Column 21,
Line 19, replace "to" with -- on --.

Signed and Sealed this

Third Day of September, 2002

Attest:

JAMES E. ROGAN
Attesting Officer  Director of the United States Patent and Trademark Office